(12) United States Patent
Zhao et al.

(10) Patent No.: US 11,281,059 B2
(45) Date of Patent: Mar. 22, 2022

(54) DISPLAY PANEL AND A DISPLAY DEVICE

(71) Applicant: Shanghai Tianma Micro-Electronics Co., Ltd., Shanghai (CN)

(72) Inventors: Jian Zhao, Shanghai (CN); Ling Shen, Shanghai (CN); Yongli Qian, Shanghai (CN); Feng Qin, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 114 days.

(21) Appl. No.: 16/916,169

(22) Filed: Jun. 30, 2020

(65) Prior Publication Data

US 2020/0333674 A1 Oct. 22, 2020

(30) Foreign Application Priority Data

May 13, 2020 (CN) .......................... 202010401217.9

(51) Int. Cl.
*G02F 1/1362* (2006.01)
*G02F 1/1368* (2006.01)
*G02F 1/1339* (2006.01)
*H01L 27/12* (2006.01)
*G02F 1/1343* (2006.01)

(52) U.S. Cl.
CPC ...... *G02F 1/136286* (2013.01); *G02F 1/1368* (2013.01); *G02F 1/13394* (2013.01); *G02F 1/13624* (2013.01); *G02F 1/134336* (2013.01); *H01L 27/124* (2013.01); *G02F 1/134345* (2021.01); *G02F 2201/123* (2013.01)

(58) Field of Classification Search
CPC ....................... G02F 1/13624; G02F 1/134345
See application file for complete search history.

(56) References Cited

U.S. PATENT DOCUMENTS

2017/0045794 A1\* 2/2017 Lin ..................... H01L 27/1218

FOREIGN PATENT DOCUMENTS

| CN | 104849890 A | 8/2015 |
| CN | 108628045 A | 10/2018 |

\* cited by examiner

*Primary Examiner* — James A Dudek
(74) *Attorney, Agent, or Firm* — Kilpatrick Townsend & Stockton, LLP

(57) ABSTRACT

Provided are a display panel and a display device. Along a column direction of the matrix, adjacent N rows of sub-pixels form a pixel unit group, N scanning lines of a same pixel unit group are electrically connected, and sub-pixels of the same pixel unit group are electrically connected to different data lines; a length of a first edge of the sub-pixel along the column direction of the matrix is smaller than a length of a second edge along a row direction; along the column direction of the matrix, adjacent N sub-pixels form a pixel unit; among N switch transistors of a same pixel unit, orthographic projections of at least two switch transistors on a preset plane at least partially overlap; among N data lines of the same pixel unit, an orthographic projection of at least one data line overlaps an orthographic projection of at least one pixel electrode.

20 Claims, 23 Drawing Sheets

DISPLAY PANEL AND A DISPLAY DEVICE

CROSS-REFERENCE TO RELATED APPLICATIONS

This application claims priority to Chinese patent application No. CN202010401217.9 filed with CNIPA on May 13, 2020, the disclosure of which is incorporated herein by reference in its entirety.

FIELD

The present disclosure relates to the field of display technologies and, particularly, to a display panel and a display device.

BACKGROUND

Compared with traditional flat display panels, a curved surface display panel more fits physiological curvatures of human eyes, which can greatly improve the user's sense of being wrapped and immersed when watching. Compared with the flat display panels, the curved surface display panel can provide better visual experience when the user is playing games, watching movies or handling daily office work.

At present, a processing method of the curved surface display panel is to fit a display panel to a cover plate with a curved surface to bend the display panel. Taking a liquid crystal display panel as an example, when the liquid crystal display panel is bent, a difference in bending curvature between a color film substrate and an array substrate causes shifting of a black matrix in the color film substrate with respect to the array substrate, thereby causing light leakage and color mixing. In order to avoid the light leakage, the black matrix is widened in the display panel. However, widening the black matrix will result in a decrease in the aperture ratio of the display panel.

SUMMARY

The present disclosure provides a display panel and a display device.

One embodiment of the present disclosure provides a display panel. The display panel includes: a substrate and a plurality of sub-pixels disposed on the substrate, where the plurality of sub-pixels is arranged in a matrix. The display panel further includes the substrate, a plurality of scanning lines extending along a row direction of the matrix and a plurality of data lines extending along a column direction of the matrix.

Each row of sub-pixels is electrically connected to a corresponding scanning line among the plurality of scanning lines; along the column direction of the matrix, adjacent N rows of sub-pixels form a pixel unit group, N scanning lines of a same pixel unit group are electrically connected, and sub-pixels of the same pixel unit group are electrically connected to different data lines.

The sub-pixel includes a first edge, a second edge, a third edge, and a fourth edge, the first edge and the third edge extend along the column direction of the matrix, and the second edge and the fourth edge extend along the row direction of the matrix; a length of the first edge along the column direction of the matrix is smaller than a length of the second edge along the row direction of the matrix.

The sub-pixel includes a switch transistor; along the column direction of the matrix, adjacent N sub-pixels form a pixel unit; among N switch transistors of a same pixel unit, orthographic projections of at least two switch transistors on a preset plane at least partially overlap, where N is an integer greater than or equal to 2; and the preset plane is perpendicular to the substrate and parallel to the plurality of scanning lines.

The sub-pixel includes a pixel electrode; among N data lines of the same pixel unit, an orthographic projection of at least one data line on the substrate overlaps an orthographic projection of at least one pixel electrode on the substrate.

Another embodiment of the present disclosure further provides a display device including the display panel described in any one of embodiments herein.

DETAILED DESCRIPTION

Figure 1:
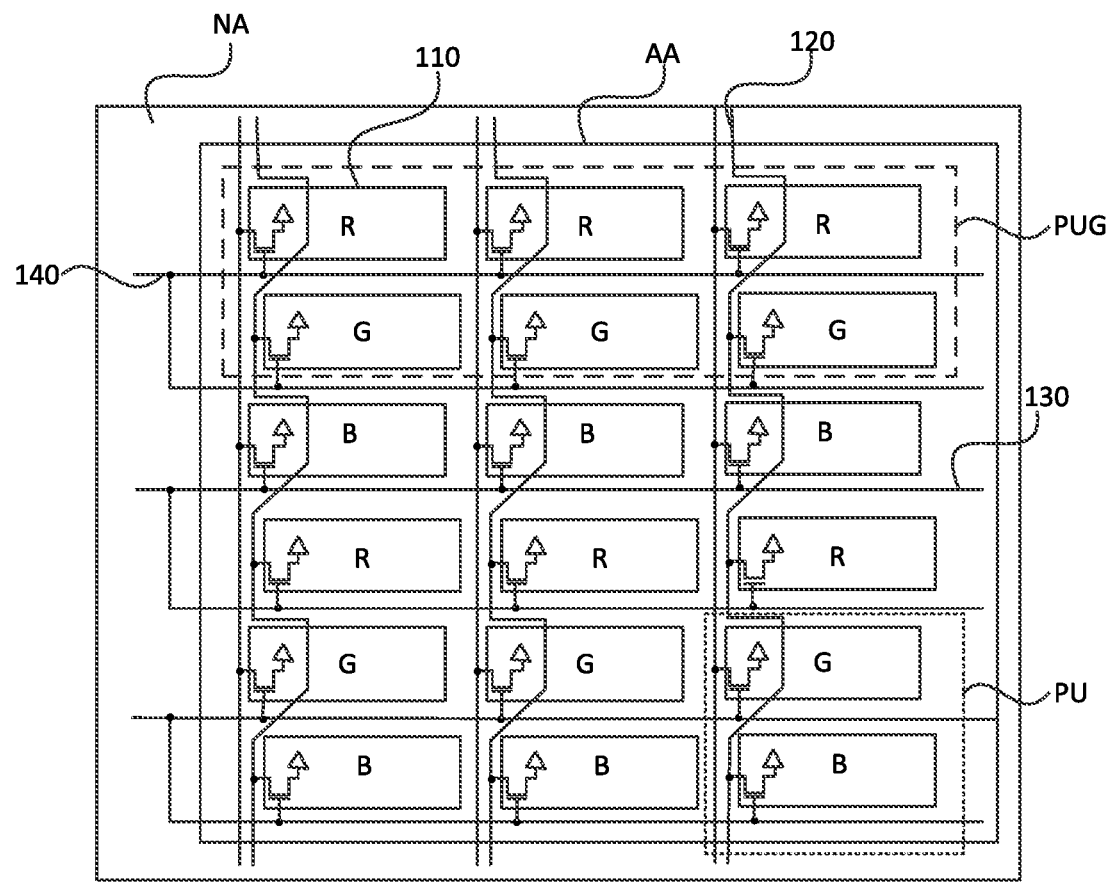
FIG. 1 is a structural diagram of a display panel according to an embodiment of the present disclosure.

Hereinafter the present disclosure will be further described in detail with reference to the drawings and embodiments It is to be understood that the embodiments set forth below are intended to illustrate and not to limit the present disclosure. Additionally, it is to be noted that, for ease of description, only part, not all, of the structures related to the present disclosure are illustrated in the drawings.

The present disclosure provides a display panel. The display panel includes a substrate and a plurality of sub-pixels disposed on the substrate, where the plurality of sub-pixels is arranged in a matrix. The display panel further includes on the substrate, a plurality of scanning lines extending along a row direction of the matrix and a plurality of data lines extending along a column direction of the matrix.

Each row of sub-pixels is electrically connected to a corresponding scanning line; along the column direction of the matrix, adjacent N rows of sub-pixels form a pixel unit group, N scanning lines of a same pixel unit group are electrically connected, and sub-pixels of the same pixel unit group are electrically connected to different data lines.

The sub-pixel includes a first edge, a second edge, a third edge, and a fourth edge, the first edge and the third edge extend along the column direction of the matrix, and the second edge and the fourth edge extend along the row direction of the matrix; a length of the first edge along the column direction of the matrix is smaller than a length of the second edge along the row direction of the matrix.

The sub-pixel includes a switch transistor; along the column direction of the matrix, adjacent N sub-pixels form a pixel unit; among N switch transistors of a same pixel unit, orthographic projections of at least two switch transistors on a preset plane at least partially overlap, where N is an integer greater than or equal to 2; and the preset plane is perpendicular to the substrate and parallel to the plurality of scanning lines.

The sub-pixel includes a pixel electrode; among N data lines of the same pixel unit, an orthographic projection of at least one data line on the substrate overlaps an orthographic projection of at least one pixel electrode on the substrate.

In view of the above, the N scanning lines corresponding to the same pixel unit group are electrically connected, and the sub-pixels of the same pixel unit group are electrically connected to different data lines, so that N rows of sub-pixels can be charged simultaneously, and the insufficient charging is solved; a length of the first edge in the matrix column direction is set to be smaller than a length of the second edge in the matrix row direction, so that when a black matrix region (in a rectangular frame shape) corresponding to each sub-pixel is widened for avoiding light leakage and color mixing, a short side of the black matrix region (namely a short side of the rectangular frame) is widened, which is conducive to improving the aperture ratio. In addition, by setting that orthographic projections of at least two switch transistors on a preset plane at least partially overlap, and an orthographic projection of the at least one data line on the substrate and an orthographic projection of the at least one pixel electrode on the substrate overlap, the at least two data lines can be compactly disposed together, thereby reducing the width of a black matrix for covering the data line and improving the aperture ratio. The effect of avoiding light leak and color mixing, reducing the risk of insufficient charging, improving the aperture ratio is implemented.

Terms used in the embodiments are merely used to describe embodiments and not intended to limit the present disclosure. It is to be noted that spatially related terms, including "on", "below", "left" and "right" used in the embodiments, are described from the perspective of the drawings, and are not to be construed as a limitation to the present disclosure. In addition, in the context, it is to be understood that when a component is formed "on" or "below" another component, the component may not only be directly formed "on" or "below" another component, and may also be indirectly formed "on" or "below" another component via an intermediate component. The terms "first", "second" and the like are only used for description and used to distinguish different components rather than indicate any order, quantity, or importance.

Figure 2:
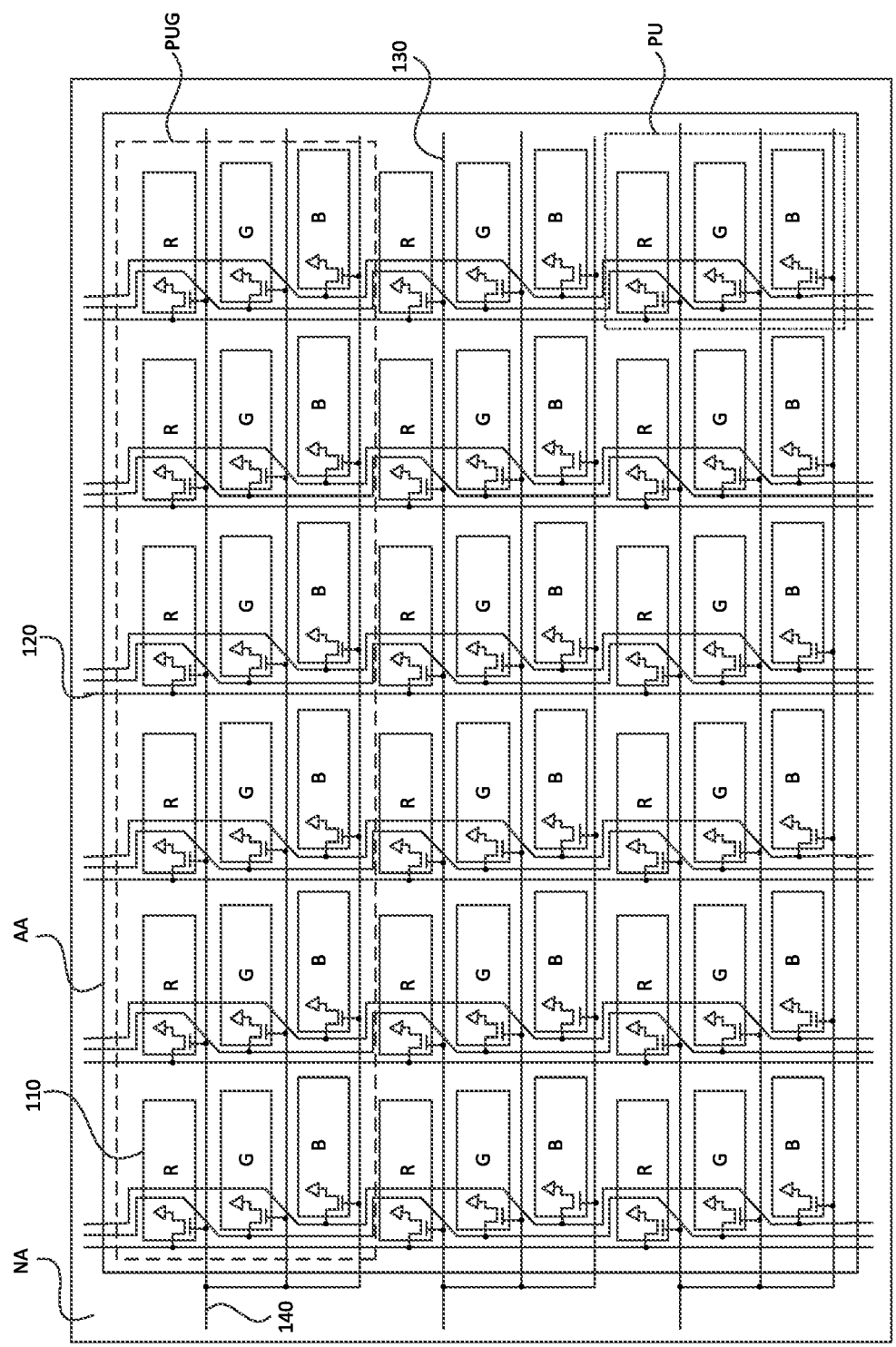
FIG. 2 is a structural diagram of another display panel according to an embodiment of the present disclosure.
Figure 3:
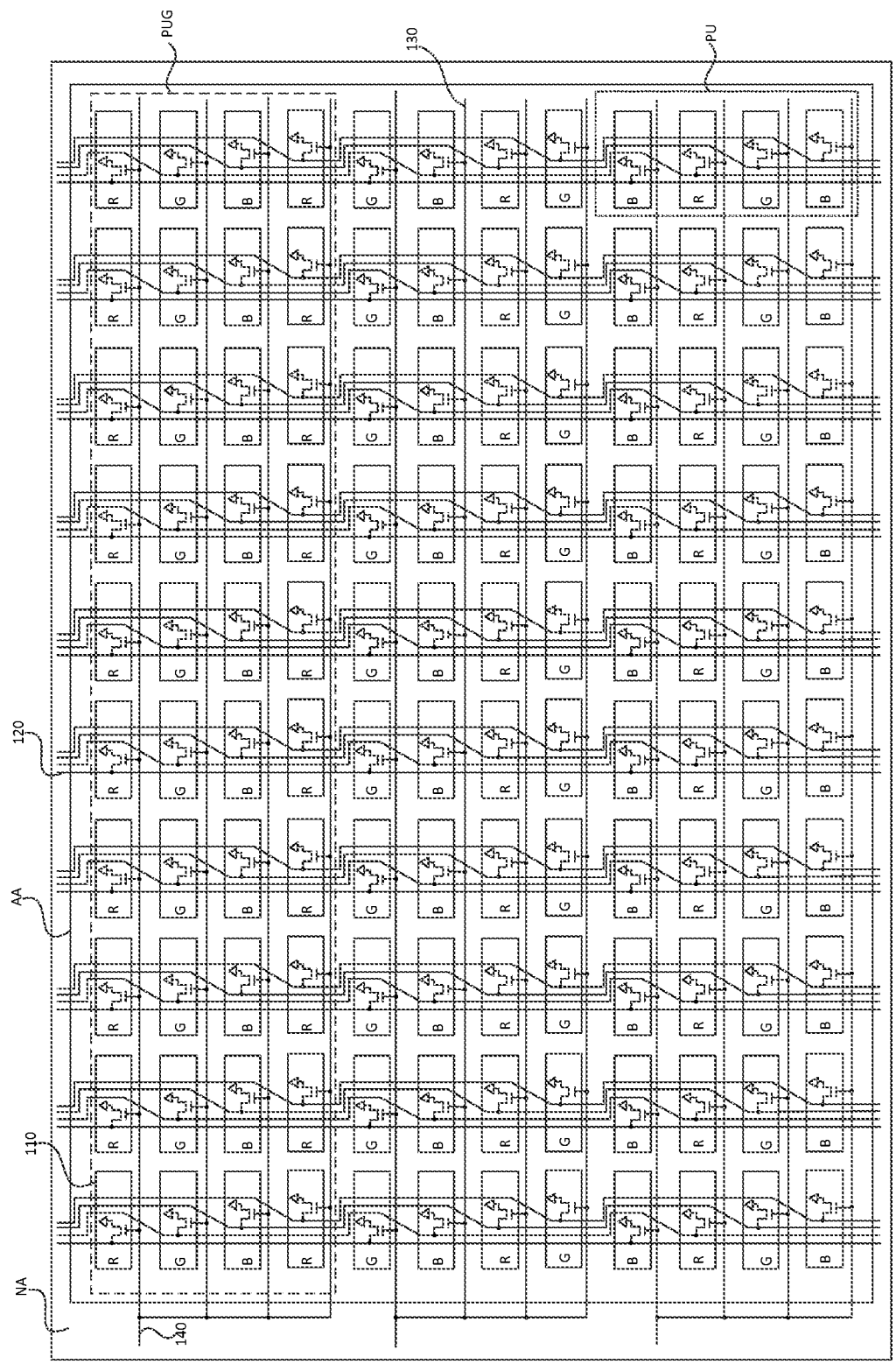
FIG. 3 is a structural diagram of yet another display panel according to an embodiment of the present disclosure.
Figure 4:
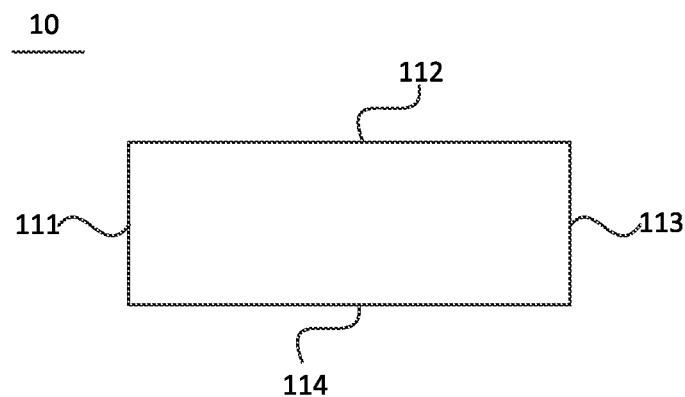
FIG. 4 is a structural diagram of a sub-pixel according to an embodiment of the present disclosure.

FIG. 1 is a structural diagram of a display panel according to an embodiment of the present disclosure. FIG. 2 is a structural diagram of another display panel according to an embodiment of the present disclosure. FIG. 3 is a structural diagram of yet another display panel according to an embodiment of the present disclosure. FIG. 4 is a structural diagram of a sub-pixel according to an embodiment of the present disclosure. With reference to FIG. 1 to FIG. 4, the display panel includes a substrate and a plurality of sub-pixels 110 disposed on the substrate, where the plurality of sub-pixels 110 is arranged in a matrix. The display panel further includes on the substrate a plurality of scanning lines 130 extending along a row direction of the matrix and a plurality of data lines 120 extending along a column direction of the matrix. Each row of sub-pixels 110 is electrically connected to a corresponding scanning line 130; along the column direction of the matrix, adjacent N rows of sub-pixels 110 form a pixel unit group PUG, N scanning lines 130 of a same pixel unit group PUG are electrically connected, and sub-pixels 110 of the same pixel unit group PUG are electrically connected to different data lines 120. Each sub-pixel 110 includes a first edge 111, a second edge 112, a third edge 113, and a fourth edge 114, the first edge 111 and the third edge 113 extend along the column direction of the matrix, and the second edge 112 and the fourth edge 114 extend along the row direction of the matrix; a length of the first edge 111 along the column direction of the matrix is smaller than a length of the second edge 112 along the row direction of the matrix. The sub-pixel 110 includes a switch transistor 112; along the column direction of the matrix, adjacent N sub-pixels 110 form a pixel unit PU; among N switch transistors 112 of a same pixel unit PU, orthographic projections of at least two switch transistors 112 on a preset plane at least partially overlap, where N is an integer greater than or equal to 2 and the preset plane is perpendicular to the substrate and parallel to the plurality of scanning lines 130. The sub-pixel includes a pixel electrode; among N data lines 120 of the same pixel unit PU, an orthographic projection of at least one data line 120 on the substrate overlaps an orthographic projection of at least one pixel electrode of the pixel unit PU on the substrate. When the display panel is bent to form a curved surface display panel, a bending direction of the display panel is the row direction of the matrix (or a extending direction of the scanning line), in other words, after the display panel is bent, a side parallel to the row direction of the matrix (or a side parallel to the extending direction of the scanning line) is bent.

In one embodiment, the display panel may be a liquid crystal display panel or other display panels. The display panel includes an opposing substrate and a color film substrate, where the opposing substrate and the color film substrate are oppositely disposed. For the convenience of explanation, the following description will take the display panel being a liquid crystal display panel as an example.

Figure 5:
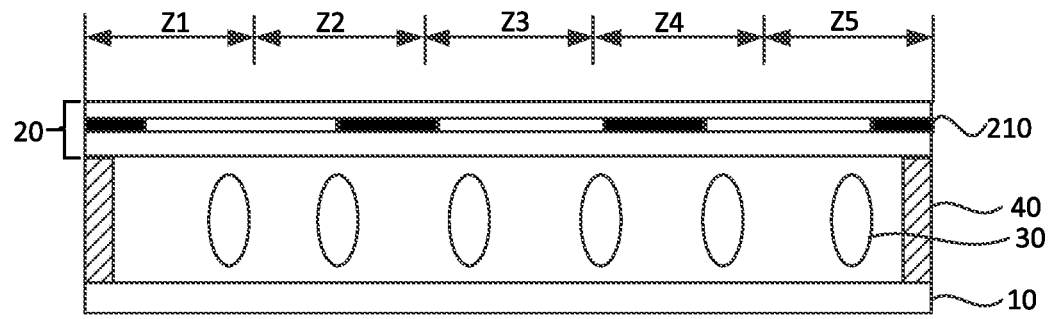
FIG. 5 is a structural diagram of a display panel before being bent according to an embodiment of the present disclosure.
Figure 6:
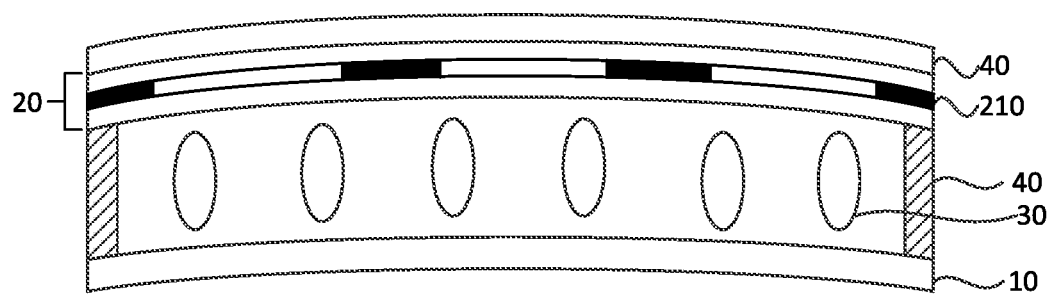
FIG. 6 is a structural diagram of a display panel after being bent according to an embodiment of the present disclosure.

Exemplarily, FIG. 5 is a structural diagram of a display panel before being bent according to an embodiment of the present disclosure. FIG. 6 is a structural diagram of a display panel after being bent according to an embodiment of the present disclosure. With reference to FIG. 5 and FIG. 6, the display panel includes an array substrate 10, a color film substrate 20, and a liquid crystal 30 disposed between the array substrate 10 and the color film substrate 20, where the color film substrate 20 includes a black matrix 210. With continued reference to FIG. 5 and FIG. 6, when the display panel is attached to the curved surface cover 40, the side of the display panel parallel to the row direction of the matrix will be bent, in other words, the side of the display panel parallel to the extending direction of the scanning line extends will be bent. Since a vertical distance between the array substrate 10 and the curved cover plate 40 and a vertical distance between the color film substrate 20 and the curved cover plate 40 are different, the array substrate 10 and the color film substrate 20 have different bending curvature radiuses, which will cause the array substrate 10 and the color film substrate 20 to shift in a horizontal direction (that is, the row direction of the matrix).

Figure 7:
FIG. 7 is a schematic diagram of a black matrix region corresponding to a sub-pixel according to an embodiment of the present disclosure.

To avoid misalignment between a sub-pixel region 110 on the array substrate 10 and a sub-pixel region 110 on the color film substrate 20, the display panel widens a width of a portion of the black matrix 210 extending along the column direction in the row direction of the matrix. Widening the width of portion of the black matrix 210 extending along the column direction in the row direction of the matrix refers to: compared to a width of the portion of the black matrix 210 extending along the column direction of the matrix when the display panel is used as a flat display panel, in the present application, the width of the portion of the black matrix 210 of the display panel extending along the column direction of the matrix is widened. Exemplarily, FIG. 7 is a schematic diagram of a black matrix region corresponding to a sub-pixel according to an embodiment of the present disclosure. Referring to FIG. 7, a black matrix region 210 corresponding to each sub-pixel 110 includes a first black matrix region 211 and a second black matrix region 212, and the first black matrix region 211 and a black matrix region corresponds to one sub-pixel 110 when the display panel is used as a flat display panel are same, and the second black matrix region 212 is a widened portion. It should be noted that, in order to help understand "widening the width of portion of the black matrix 210 extending along the column direction in the row direction of the matrix", a black matrix region 210 corresponding to one sub-pixel 110 is artificially divided into the first black matrix region 211 and the second black matrix region 212 in FIG. 7, and the first black matrix region 211 and the second black matrix region 212 are filled with different filling patterns. However, in practice, the first black matrix region 211 and the second black matrix region 212 are located in a same layer and are formed in a same process.

It can be understood that since the width of the portion of the black matrix 210 extending along the column direction of the matrix in the row direction of the matrix is widened, even if the array substrate 10 and the color film substrate 20 are shifted with respect to each other in the horizontal direction, a vertical projection of the black matrix 210 on the substrate can still cover a vertical projection of a non-sub-pixel region 110 of the array substrate 10 on the substrate, and the sub-pixel region on the array substrate 10 can also completely correspond to the sub-pixel region on the color film substrate 20. In this way, light leakage and color mixing can be avoided.

It can be understood that by setting the length of the first edge along the column direction of the matrix to be smaller than the length of the second edge along the row direction of the matrix, the width of the portion of the black matrix 210 extending along the column direction of the matrix in the row direction of the matrix can be widened, and a widened region of the black matrix region 210 corresponding to the each pixel 110 is relatively small, which is conductive to eliminating light leakage and color mixing while ensuring the aperture ratio. In order to explain this beneficial effect in detail, description will be provided below through comparison by taking the display panel in the related art as an example for the comparison.

Figure 8:
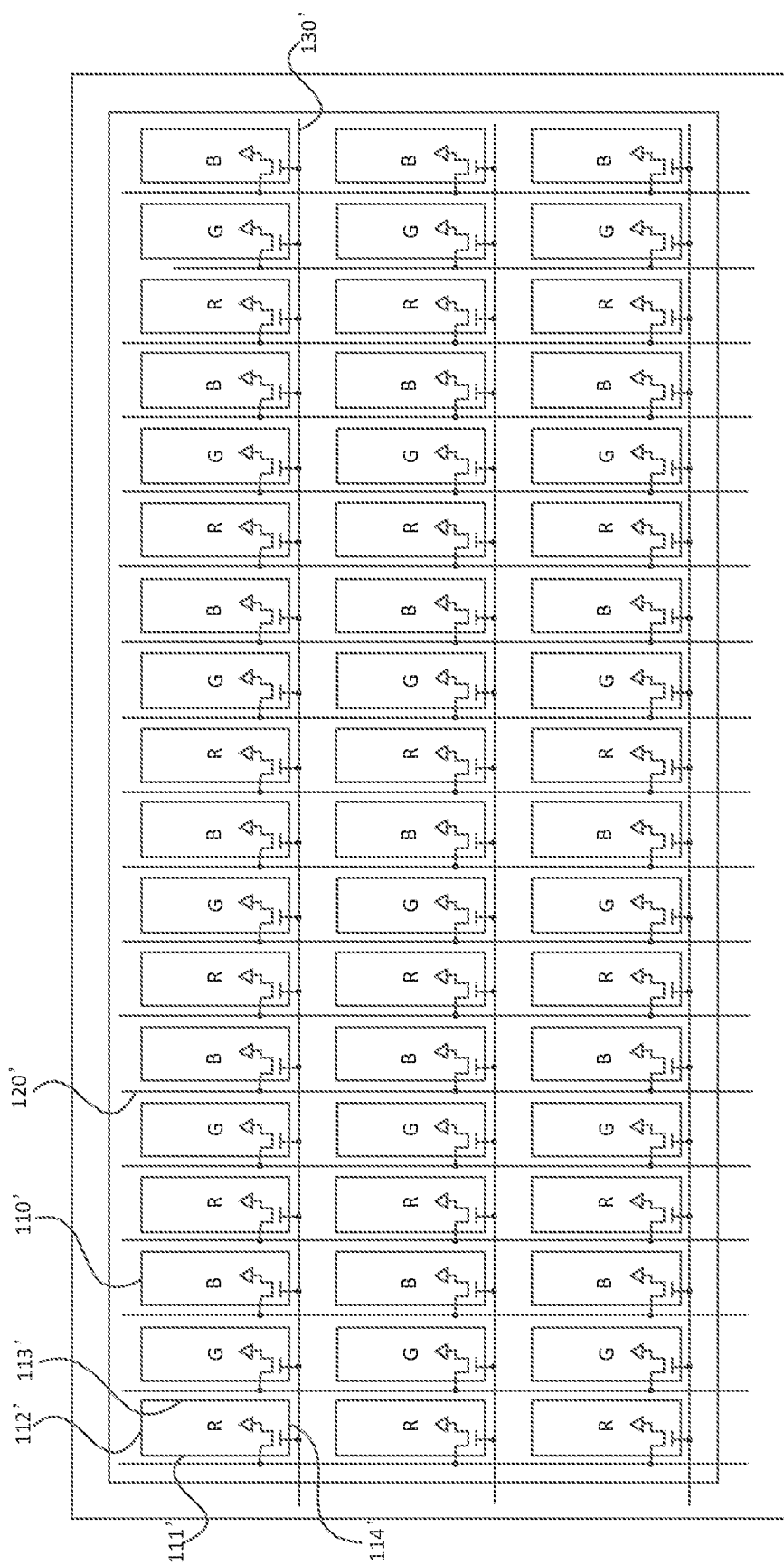
FIG. 8 is a structural diagram of a display panel in the related art.
Figure 9:
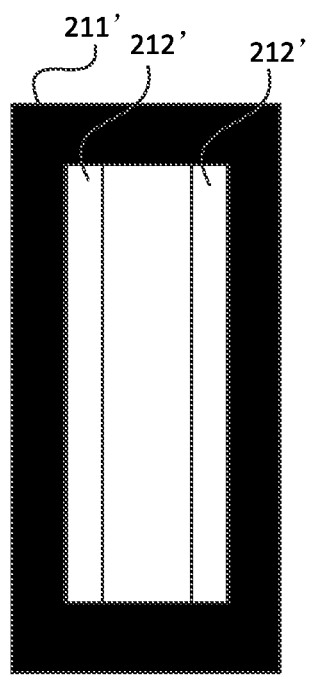
FIG. 9 is a schematic diagram of a black matrix region corresponding to a sub-pixel after the black matrix is widened in the display panel shown in FIG. 8.

Exemplarily, FIG. 8 is a structural diagram of a display panel in the related art. FIG. 9 is a schematic diagram of a black matrix region corresponding to a sub-pixel after the black matrix is widened in the display panel shown in FIG. 8. With reference to FIG. 8, the display panel includes a plurality of sub-pixels 110' arranged in a matrix, a plurality of data lines 120', and a plurality of scanning lines 130'. The sub-pixel 110' includes a first edge 111', a second edge 112', a third edge 113', and a fourth edge 114', the first edge 111' and the third edge 113' extend along the column direction of the matrix, and the second edge 112' and the fourth edge 114' extend along the row direction of the matrix; a length of the first edge 111' along the column direction of the matrix is smaller than a length of the second edge 112' along the row direction of the matrix. With reference to FIG. 9, after the width of the portion of the black matrix 210 extending along the column direction of the matrix in the row direction of the matrix is widened, the black matrix region 210 corresponding to the each sub-pixel 110 includes a first black matrix region 211' and a second black matrix region 212'. The first black matrix region 211' and the black matrix region 210 corresponding to one sub-pixel 110 when the display panel is used as a flat display panel are same, and the second black matrix region 212' is a widened portion.

With reference to FIG. 7 and FIG. 9, when the length of the first edge along the column direction of the matrix is smaller than the length of the second edge along the column direction of the matrix, the short edge in the black matrix region corresponding to the each sub-pixel 110 is widened; when the length of the first edge along the column direction of the matrix is greater than the length of the second edge along the column direction of the matrix, the long side in the black matrix region corresponding to the each sub-pixel 110 is widened. In other words, by setting the length of the first edge along the column direction of the matrix to be smaller than the length of the second edge along the row direction of the matrix, the area of the black matrix region corresponding to the each sub-pixel 110 can be widened relatively small, thereby increasing the aperture ratio.

It can be understood that, by setting N scanning lines 130 of the same pixel unit group PUG to be electrically connected and the sub-pixels 110 of the same pixel unit group PUG to be electrically connected to different data lines 120, N rows of sub-pixels 110 can be charged simultaneously, so that when scanning time of each frame of display picture is fixed, compared with a case of charging row by row, the case of charging N rows of sub-pixels 110 simultaneously can make the time for charging each row of sub-pixels 110 relatively longer, and the risk of insufficient charging can be avoided.

In one embodiment, a specific value of N may be set according to a practical situation, which is not limited in the present application. Exemplarily, N=2, as shown in FIG. 1; or N=3, as shown in FIG. 2; or N=4 as shown in FIG. 3.

In addition, by setting that orthographic projections of at least two switch transistors on a preset plane at least partially overlap, and an orthographic projection of the at least one data line 120 on the substrate and an orthographic projection of the at least one pixel electrode on the substrate overlap, the at least two data lines 120 can be compactly disposed together, thereby reducing the width of a black matrix 210 for covering the data line 120 and improving the aperture ratio.

On the basis of the above, in an embodiment, pixel electrodes of each sub-pixel 110 have a same area. In general, for liquid crystal display, a storage capacitor is formed between a pixel electrode and a common electrode for driving liquid crystal to rotate, and when the pixel electrode of each sub-pixel 110 have a same area, storage capacitor of each sub-pixel 110 can be same, so that gray scale voltages of each sub-pixel 110 can be uniformly adjusted, thereby simplifying the driving method.

In one embodiment, the same area of the pixel electrode of each sub-pixel 110 can be implemented by setting that at least two adjacent sub-pixels 110 in the same pixel unit PU are staggered along the row direction of the matrix, as shown in FIG. 1 and FIG. 2. In one embodiment, the same area of the pixel electrode of each sub-pixel 110 can be implemented by setting that at least two adjacent sub-pixels 110 in the same pixel unit PU are flush along the row direction of the matrix, as shown in FIG. 3. The implementation of the adjacent sub-pixels 110 being flush and staggered along the row direction of the matrix is not described here, and will be explained in conjunction with the display panel structure.

In one embodiment, various setting manners of the switch transistors 112, the data lines 120, the pixel electrodes, and the adjacent sub-pixels 110 in the display panel exist, which are flush and offset in the matrix row direction, and the following description will explain typical examples according to the setting position classification of the data lines 120, but the present application is not limited thereto.

First, first-type arrangement of data lines 120 is as follows.

Figure 10:
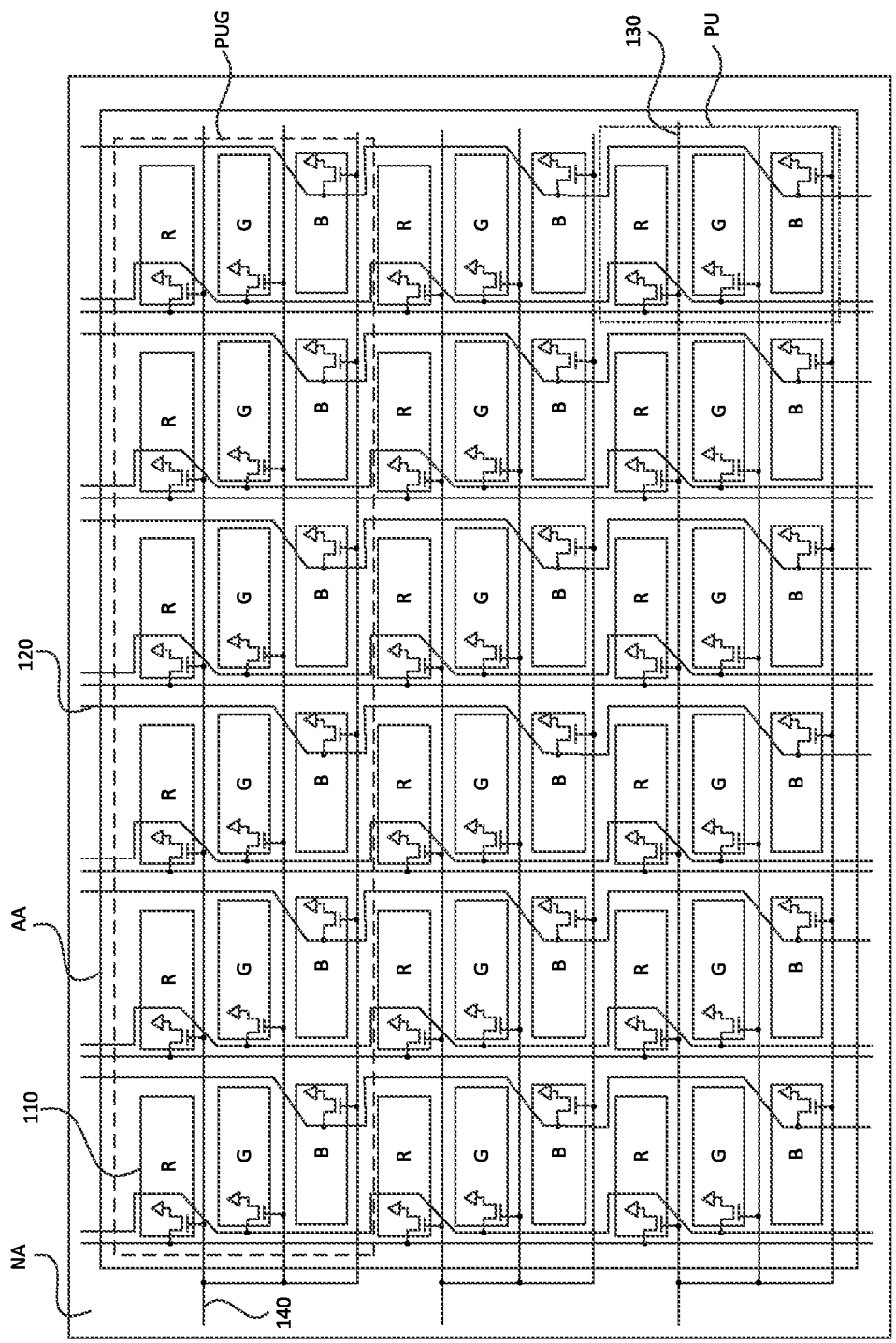
FIG. 10 is a structural diagram of a display panel according to an embodiment of the present disclosure.

FIG. 10 is a structural diagram of a display panel according to an embodiment of the present disclosure. Referring to FIG. 10, in an embodiment, orthogonal projections of N data lines 120 of a same pixel unit PU on the plane where the pixel electrodes are located are between two adjacent columns of pixel electrodes, and among the N data lines 120 of the same pixel unit PU, at least one data line 120 is disposed on a first side of a sub-pixel 110 electrically connected to the at least one data line 120, and at least one data line 120 is disposed on the second side of the sub-pixel 110 electrically connected to the at least one data line 120, where the first side of the sub-pixel is opposite to the second side of the sub-pixel.

It should be noted that, as merely exemplarily shown in FIG. 10, N=3; and among 3 data lines 120 of the same pixel unit PU, one data line 120 is disposed on a first side of the sub-pixel 110 electrically connected to the one data line 120 (FIG. 10 exemplarily shows that the right side of the sub-pixel 110 is a first side of the sub-pixel 110), and two data lines 120 are disposed on a second side of the sub-pixel 110 electrically connected to the two data lines 120 (FIG. 10 exemplarily shows that a left side of the sub-pixel 110 is the second side of the sub-pixel 110), which is not limited by the present application. Among the N data lines 120, a number of data lines 120 disposed on the first side of the sub-pixels 110 electrically connected and a number of data lines 120 disposed on the second side of the sub-pixels 110 electrically connected may be set according to the practical situation.

In one embodiment, each switch transistor 112 may be disposed on a first side of the data line 120 electrically connected to the each switch transistor 112, as shown in FIG. 10; or, part of switch transistors 112 may also be disposed on a first side of the data line 120 electrically connected to the portion of switch transistors, and part of switch transistors 112 may be disposed on the second side of the data line 120 electrically connected to the portion of switch transistors, which is not limited in this application.

Figure 11:
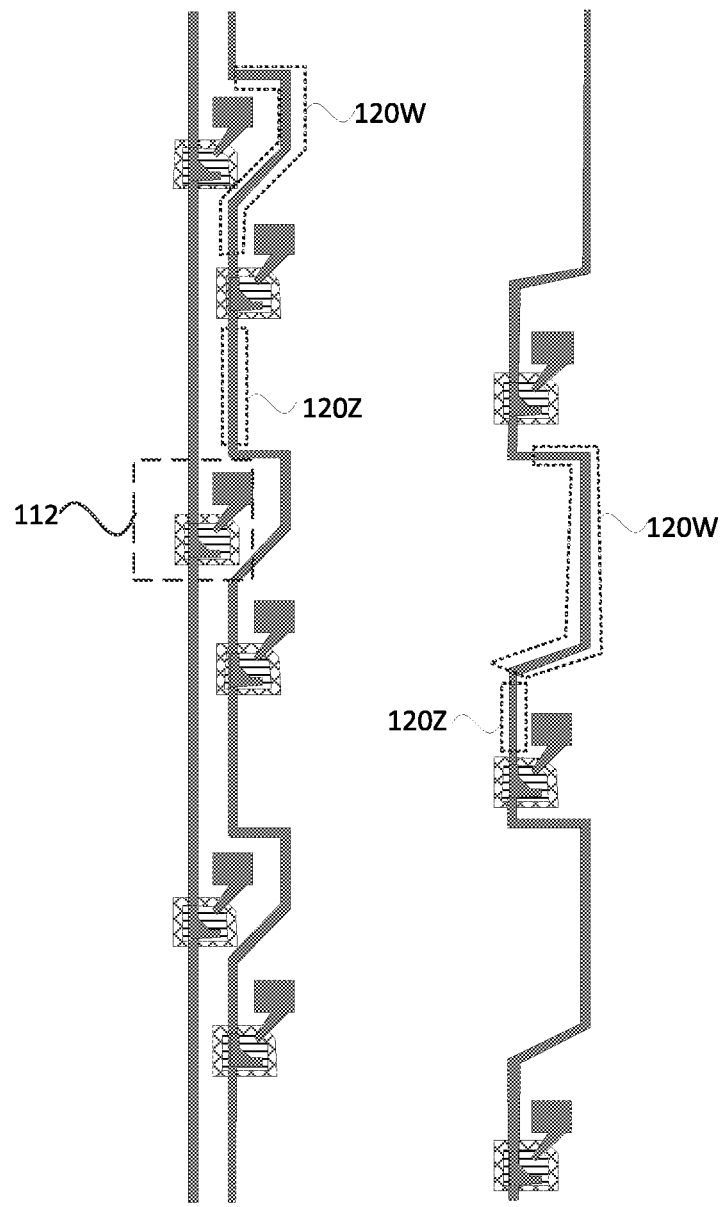
FIG. 11 is a layout of N data lines of a same pixel unit of the display panel shown in FIG. 10.

FIG. 11 is a layout of N data lines of a same pixel unit of the display panel shown in FIG. 10. With continued reference to FIG. 10 and FIG. 11, in an embodiment, each switch transistor 112 is disposed on the first side of the data line 120 electrically connected to the each switch transistor 112 (FIG. 11 exemplarily shows that the right side of the data line 120 is the first side of the data line 120); among the N data lines 120 of the same pixel unit PU, one data line 120 is a straight line, and each of other N−1 data lines 120 adjacent to the one data line 120 includes a straight line segment 120Z and a bent segment 120W which are connected to each other, where the bent segment 120W partially surrounds a switch transistor 112 located on a second side of the data line 120 (FIG. 11 exemplarily shows that the left side of the data line 120 is the second side of the data line 120).

Exemplarily, the switch transistor 112 electrically connected to the data line 120 is also exemplarily shown in FIG. 11, where a polygon having a filling pattern of a mesh type indicates a gate of the switch transistor 112, a polygon having a filling pattern of horizontal line indicates an active layer of the switch transistor 11, a "L" type pattern indicates a drain of the switch transistor 112, which is electrically connected to the data line 120, and a "9" shaped pattern indicates a source of the switch transistor 112, which is electrically connected to a pixel electrode (not shown in FIG. 11). With continued reference to FIG. 11, the data line 120 described herein as a straight line and the data line 120 described below as a straight line each mean that along the column direction of the matrix, the data line 120 between switch transistors 112 of two adjacent sub-pixels 110 is a straight line. It should be noted that, in a practical manufacturing process of the display panel, the data line 120, the source and the drain of the switch transistor 112 may be disposed in a same layer, as shown in FIG. 11, so that the data line 120, the source and the drain may be manufactured and formed through a same process. It should be noted that FIG. 11 only shows that the switch transistor 112 has a bottom-gate structure, but the structure of the switch transistor 112 in the present application is not limited thereto, and in other implementations, the switch transistor 112 may have a top-gate structure.

It is understood that, by setting that the data line 120 includes a straight line segment 120Z and a bent segment 120W which are connected to each other, and the bent segment 120W partially surrounds the switch transistor 112 disposed on the second side of the data line 120, adjacent data lines 120 and switch transistors 112 electrically connected to the adjacent data lines 120 can be disposed together compactly, for example, among 3 data lines 120 corresponding to a leftmost column of sub-pixels 110 shown in FIG. 11, two data lines 120 disposed on the second side of the sub-pixels 110 electrically connected to the two data lines 120 and the switch transistors 112 electrically connected to the two data lines 120 are disposed together compactly, and at the same time, one data line 120 disposed on the first side of the sub-pixels 110 electrically connected to the one data line 120 is disposed together compactly with two data lines 120 corresponding to an adjacent column of sub-pixels 110 and the switch transistors 112 electrically connected to the 3 data lines 120. In this way, the space occupied by the data lines 120 and the switch transistors 112 can be reduced, and the width of the black matrix 210 corresponding to the position of the data lines 120 and the switch transistors 112 can be further reduced, thereby increasing the aperture ratio, in other words, the switch transistors 112 electrically connected to the data lines 120 utilizes the space left by the partially surrounding arrangement through an arrangement manner of part of the data lines partially surrounding the switch transistor 112, and the aperture ratio can be increased after the black matrix 210 covers the switch transistors 112 and the data lines 120.

Then, second-type arrangement of data lines 120 is as follows.

Figure 12:
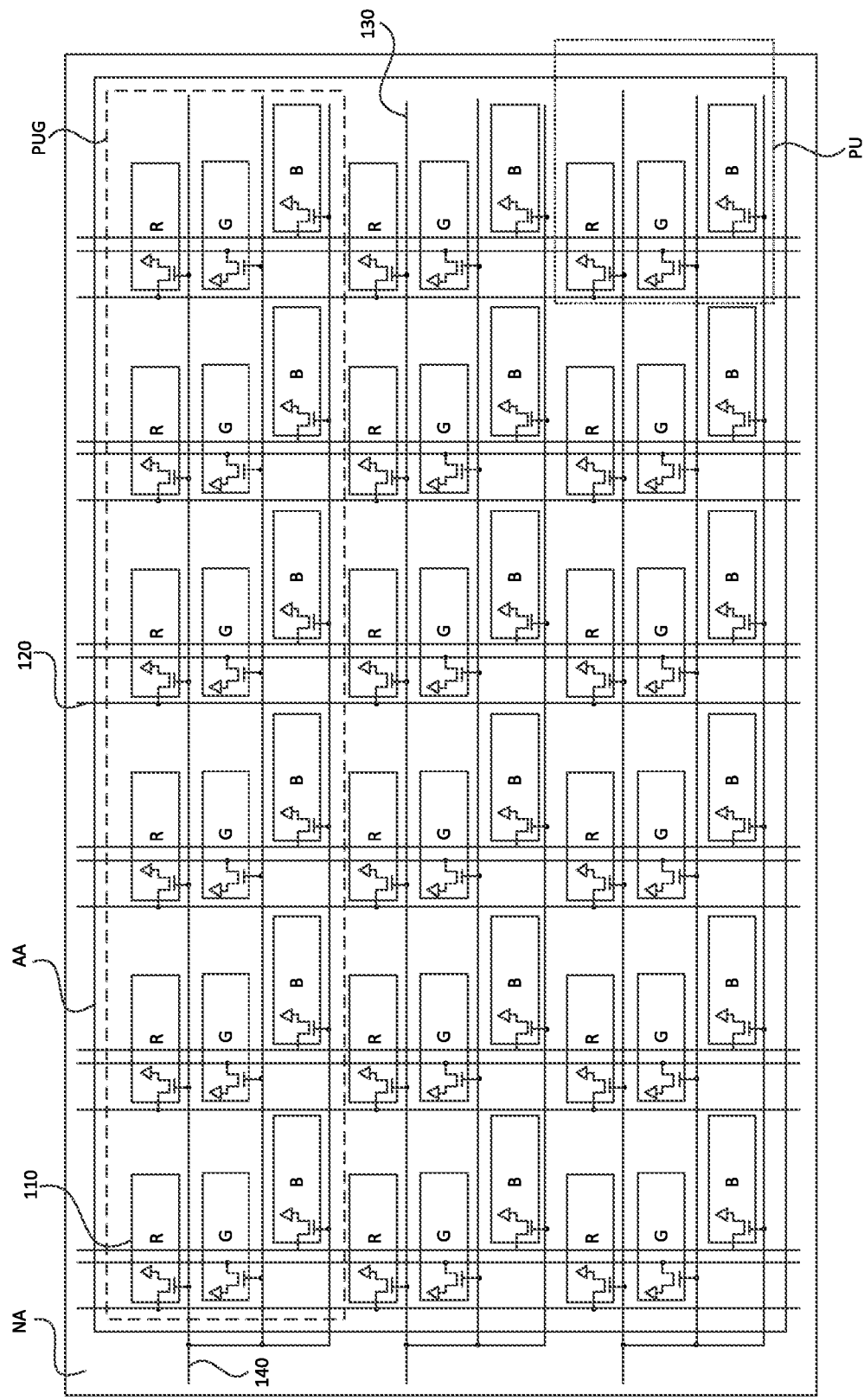
FIG. 12 is a structural diagram of another display panel according to an embodiment of the present disclosure.
Figure 13:
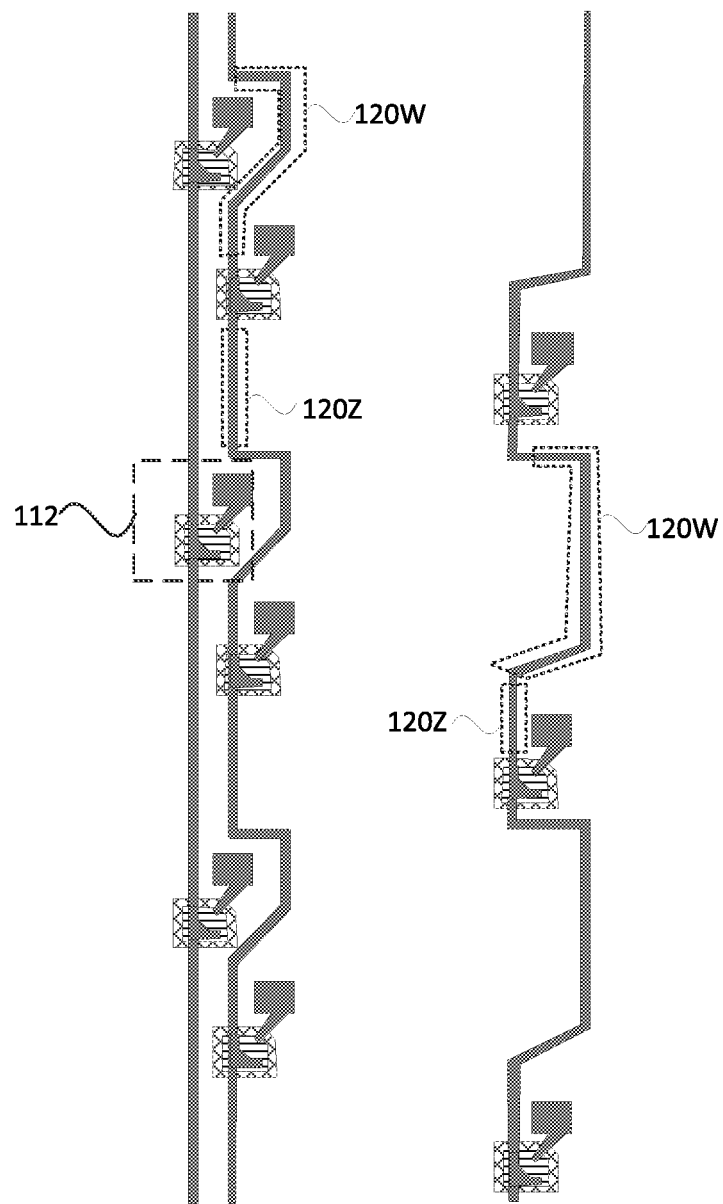
FIG. 13 is a layout of N data lines of a same pixel unit of the display panel shown in FIG. 12.

FIG. 12 is a structural diagram of another display panel according to an embodiment of the present disclosure. FIG. 13 is a layout of N data lines of a same pixel unit of the display panel shown in FIG. 12. Referring to FIG. 12 and FIG. 13, in an embodiment, orthogonal projections of the N data lines 120 of the same pixel unit PU on the plane where the pixel electrodes are located are between two adjacent columns of pixel electrodes, and the N data lines 120 of the same pixel unit PU are disposed on a same side of the sub-pixels 110 electrically connected to the N data lines 120. In an embodiment, among the N switch transistors 112 of the same pixel unit PU, along the column direction of the matrix, two adjacent switch transistors are disposed on different sides of the data line 120 electrically connected to the two adjacent switch transistors; each data line 120 is a straight line.

In one embodiment, two adjacent data lines 120 form a data line group 120U, and when N is an odd number, the N data lines 120 include (N−1)/2 data line groups 120U and one independent data line 120, as shown in FIG. 12 and FIG. 13; when N is an even number, N data lines 120 include N/2 data line groups 120U. In the same data line group 120U, a distance L along the row direction of the matrix between a switch transistor 112 electrically connected to one data line 120 and another data line 120 may be set according to a practical situation, and in an embodiment, L may be set to be a minimum distance that can be achieved in a practical process, so that the space occupied by each data line group 120U and the switch transistor 112 electrically connected to the data line group 120U is smaller, and further, the width of the black matrix 210 corresponding to the positions of the data line 120 and the switch transistor 112 is smaller, which is beneficial to improving the aperture ratio.

It can be understood that, by setting each data line 120 as a straight line, the layout design of the data line 120 is simple and the manufacturing difficulty is low.

Figure 14:
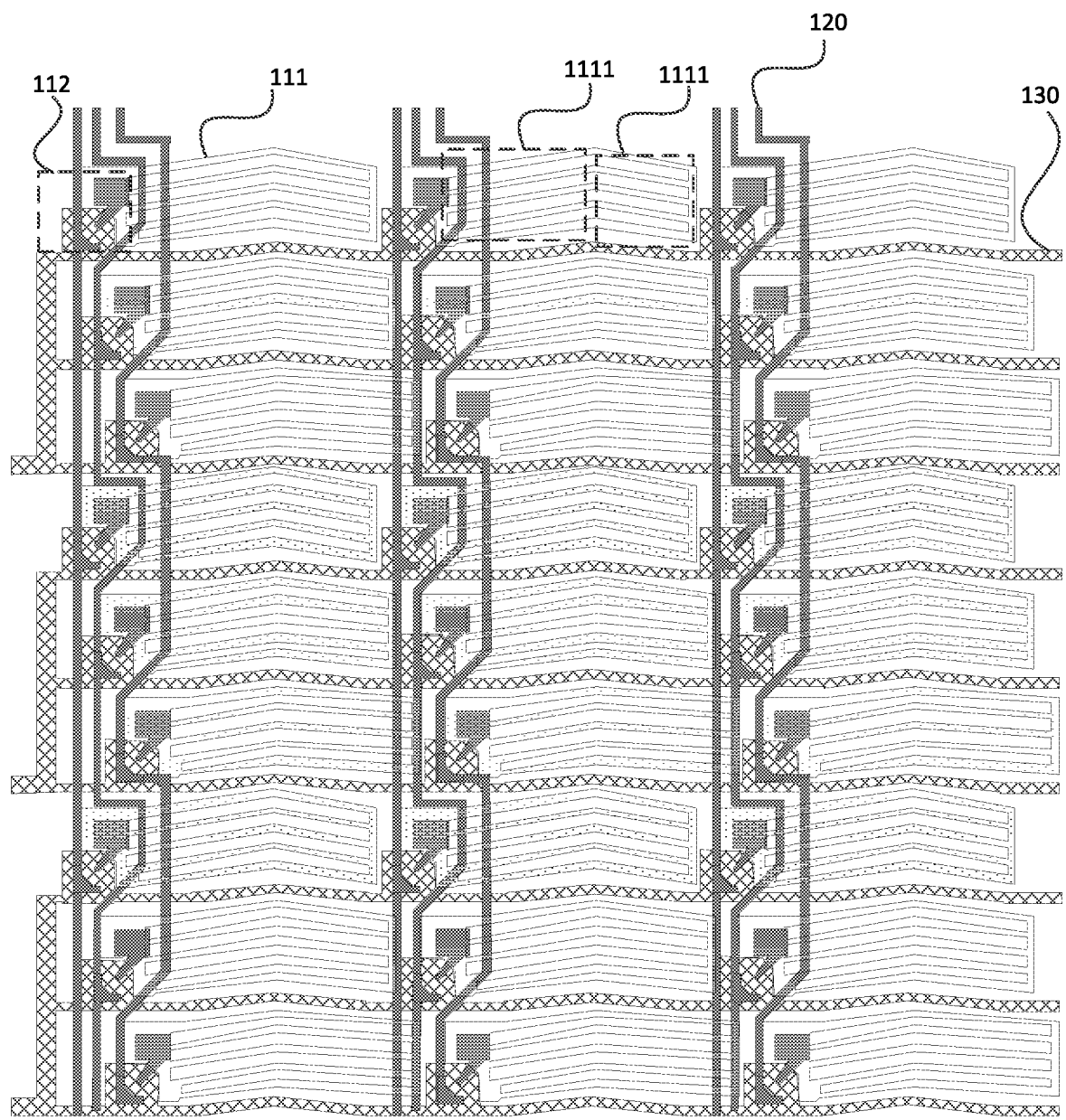
FIG. 14 is a layout of an array substrate of the display panel shown in FIG. 2.
Figure 15:
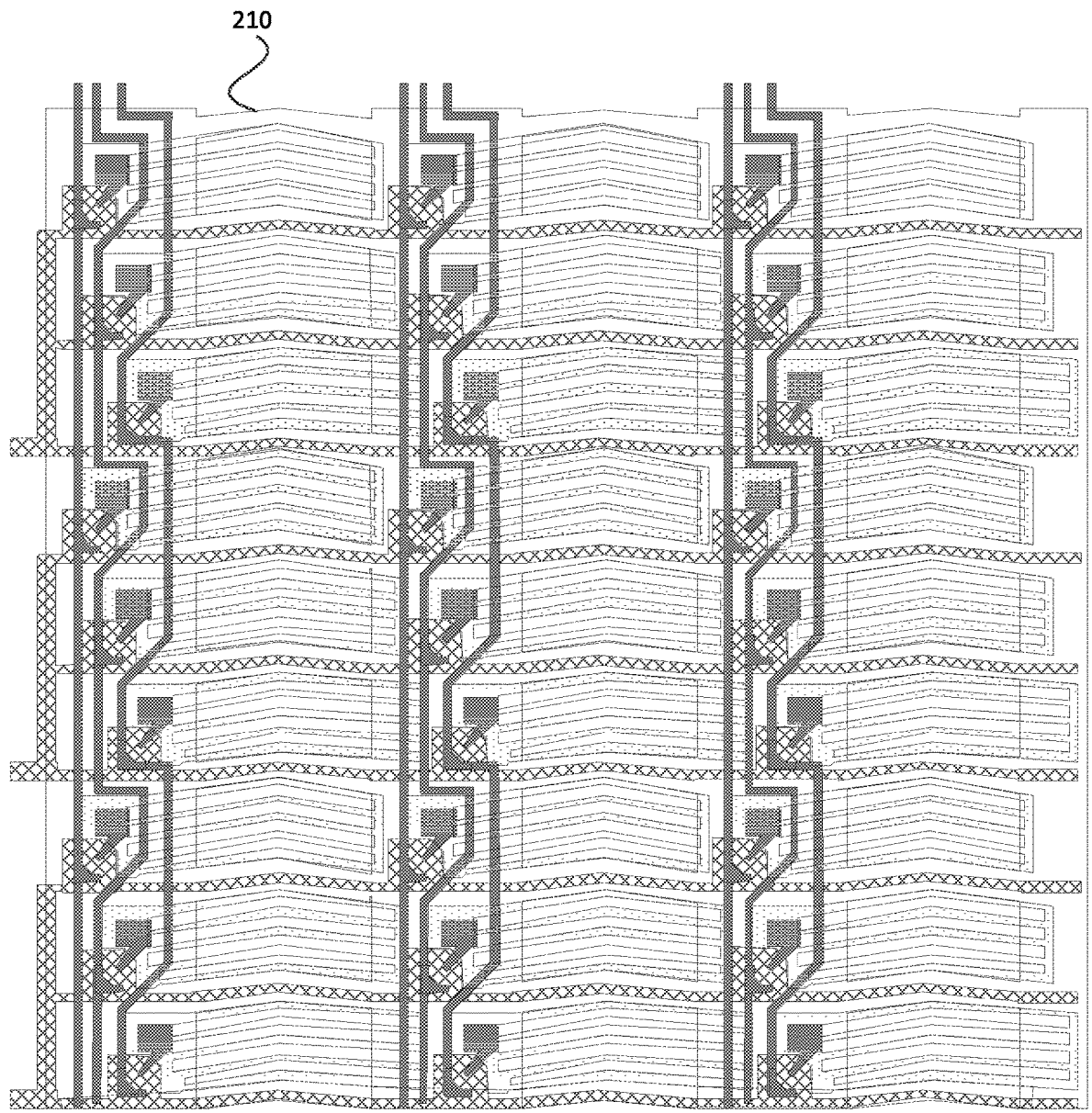
FIG. 15 is a layout of the display panel shown in FIG. 2.

FIG. 14 is a layout of an array substrate of the display panel shown in FIG. 2. FIG. 15 is a layout of the display panel shown in FIG. 2. Referring to FIG. 2, FIG. 14 and FIG. 15, in an embodiment, orthogonal projections of the N data lines 120 of the same pixel unit PU on the plane where the pixel electrodes are located are between two adjacent columns of pixel electrodes, and the N data lines 120 of the same pixel unit PU are disposed on a same side of the sub-pixels 110 electrically connected to the N data lines 120. In an embodiment, each switch transistor 112 is disposed on a first side of the data line 120 electrically connected to the each switch transistor 112; among the N data lines 120 of the same pixel unit PU, one data line 120 is a straight line, and each of other adjacent N−1 data lines 120 includes a straight line segment 120Z and a bent segment 120W connected to each other, and the bent segment 120W partially surround the switch transistor 112 disposed one the second side of the data line 120, where the first side and the second side are opposite.

In one embodiment, the data line 120 may be disposed on a first side of the pixel electrode electrically connected to the data line 120 (FIG. 14 exemplarily shows that a right side of the pixel electrode is the first side of the pixel electrode); the data line 120 may also be disposed on a second side of the pixel electrode electrically connected to the data line 120 (FIG. 14 exemplarily shows that the left side of the pixel electrode is the second side of the pixel electrode), as shown in FIG. 2 and FIG. 14, which is not limited in this application.

It can be understood that the N data lines 120 of the same pixel unit PU are disposed one the same side of the sub-pixels 110 electrically connected to the N data lines 120, so that part of stripe-shaped black matrices 210 extending along the column direction of the matrix have a same width, as shown in FIG. 15, and thus the black matrices 210 are simple in design and have low process difficulty.

In one embodiment, the straight line segment 120Z and the bent segment 120W of the data line 120 can be understood by referring to FIG. 11, which is not described herein again. It is understood that by setting that the data lines 120 each include the straight line segment 120Z and the bent segment 120W connected to each other, and the bent segment 120W partially surround the switch transistor 112 on the second side of the data line 120, the adjacent data lines 120 and switch transistors 112 electrically connected to the adjacent data lines 120 can be disposed together compactly, for example, shown in FIG. 2 and FIG. 14, three data lines 120 corresponding to the leftmost column of sub-pixels 110 and the switch transistors 112 electrically connected to the three data lines 120 can be disposed together compactly. In this way, the space occupied by the data lines 120 and the switch transistors 112 can be reduced, and the width of the black matrix 210 corresponding to the position of the data lines 120 and the switch transistors 112 can be reduced, thereby improving the aperture ratio.

Figure 16:
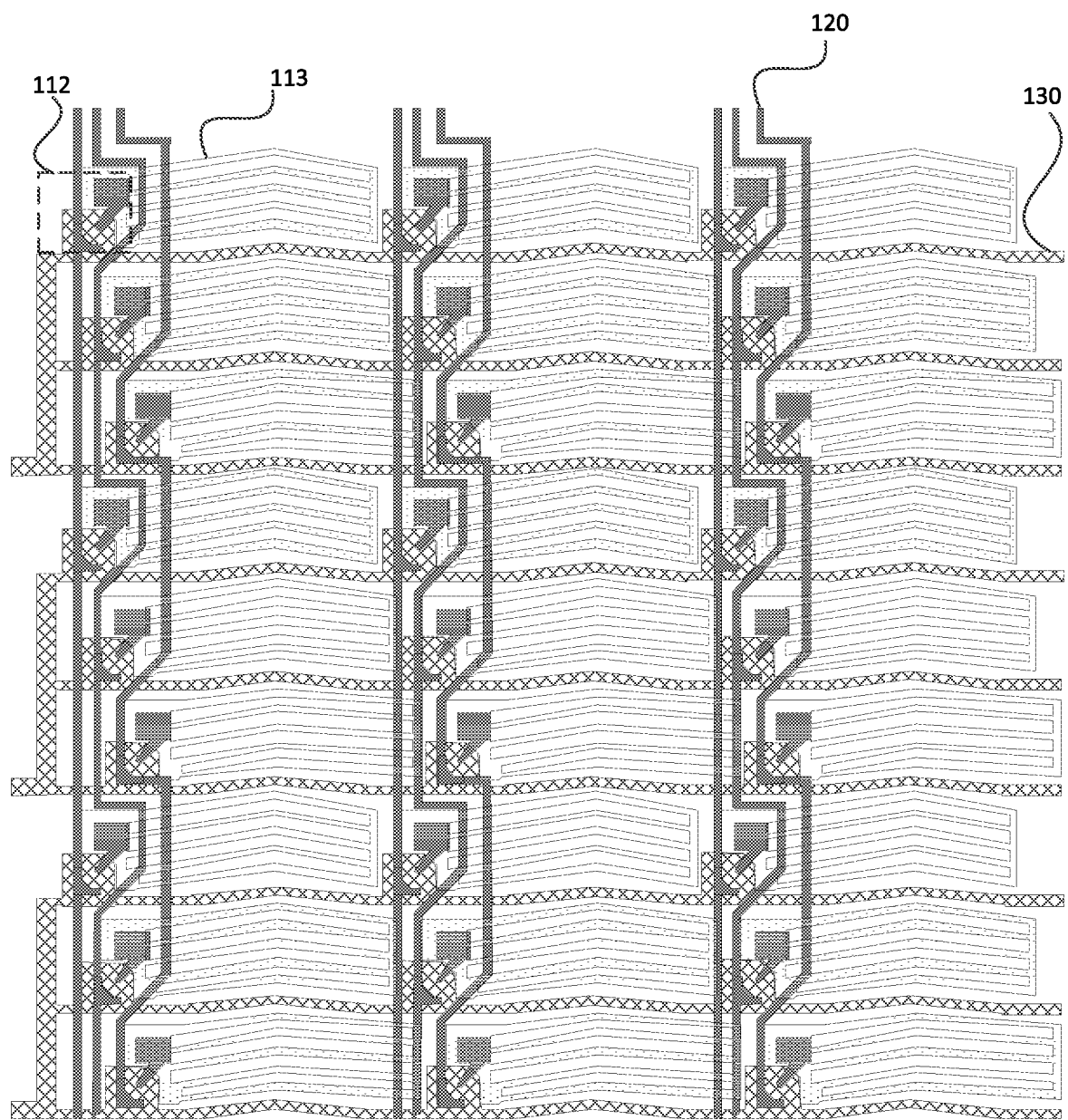
FIG. 16 is another layout of the array substrate of the display panel shown in FIG. 2.
Figure 17:
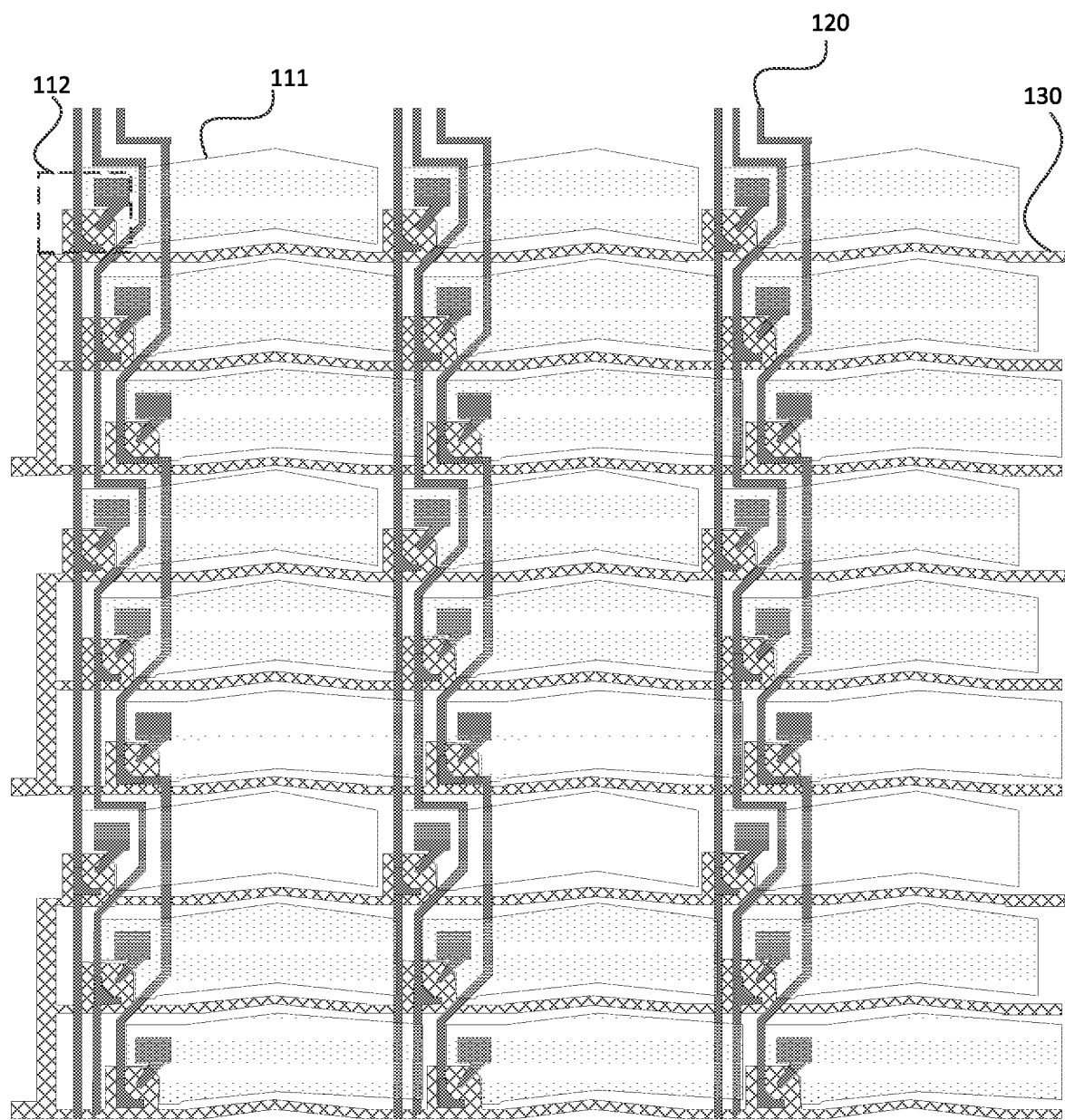
FIG. 17 is yet another layout of the array substrate of the display panel shown in FIG. 2.

In one embodiment, with continued reference to FIG. 5, for the display panel based on liquid crystal, the driving electrode includes a pixel electrode and a common electrode, and there are various positional relationships between the pixel electrode and the common electrode, for example, a first type is as shown in FIG. 14, the pixel electrode 111 and the common electrode (not shown in FIG. 14) each are disposed on the array substrate 10, and the pixel electrode 111 is disposed on a side of the common electrode far away from the substrate, in this case, the common electrode may be disposed on a whole surface, that is, the common electrodes of sub-pixels 110 are connected to each other, and at the same time, a plurality of slits are configured on the pixel electrode 111, so that the pixel electrode 111 and the common electrode form a transverse electric field. In a second type, FIG. 16 is another layout of the array substrate of the display panel shown in FIG. 2. Referring to FIG. 16, the pixel electrode (not shown in FIG. 16) and the common electrode 113 each are disposed on the array substrate 10, and the pixel electrode is disposed on a side of the common electrode 113 close to the substrate, in this case, the pixel electrode and the common electrode 113 each are block electrodes, and at the same time, a plurality of slits are disposed on the common electrode 113, so that the pixel electrode and the common electrode 113 form a transverse electric field. Exemplarily, vertical projections of edge contour lines of the pixel electrode and the common electrode 113 on the substrate may coincide, that is, the pixel electrode and the common electrode 113 are different in that slits are disposed on the common electrode 113, and no slit is disposed on the pixel electrode. In a third type FIG. 17 is yet another layout of the array substrate of the display panel shown in FIG. 2. Referring to FIG. 17, the pixel electrode 111 is disposed on the array substrate 10, the common electrode is disposed on the color film substrate 20, and the pixel electrode 111 and the common electrode each are block electrodes and the pixel electrode 111 and the common electrode form a vertical electric field. It should be noted that FIG. 14 to FIG. 16 only exemplarily show that the slits are stripe-shaped and arranged along the column direction of the matrix, but the present application is not limited thereto, and the shape and arrangement manner of the slits can be set according to the practical situation.

With continued reference to FIG. 14 to FIG. 17, in an embodiment, in the same pixel unit PU, the pixel electrodes 111 of the sub-pixels 110 have a same area, and two adjacent sub-pixels 110 are staggered along the row direction of the matrix. In one embodiment, in the same pixel unit PU, the switch transistors 112 of the sub-pixels 110 are sequentially staggered along the row direction of the matrix, and the pixel electrodes 111 of the sub-pixels 110 are sequentially staggered along the row direction of the matrix, so that the pixel electrodes 111 of the sub-pixels 110 have a same area. Exemplarily, in the layout of the display panel shown in FIG. 14, the same pixel unit PU includes three sub-pixels 110 which are electrically connected to three data lines 120. The switch transistors 112 of the three sub-pixels 110 are sequentially staggered along the row direction of the matrix, at the same time, the pixel electrodes 111 of the three sub-pixels 110 are sequentially staggered along the row direction of the matrix, and each sub-pixel 110 includes two slit groups 1111; orthographic projections of the three data lines 120 electrically connected to the three sub-pixels 110 on the plane where the pixel electrodes 111 are located are between two adjacent columns of pixel electrodes 111 and disposed on the second side of the sub-pixels 110 electrically connected to the data lines, one of the three data lines 120 is a straight line, each of the other two data lines 120 include a straight line segment 120Z and a bent segment 120W, and the bent segment 120W semi-surrounds the switch transistor 112 disposed on the second side of the data line 120.

Finally, third-type arrangement of data lines 120 is as follows.

Figure 18:
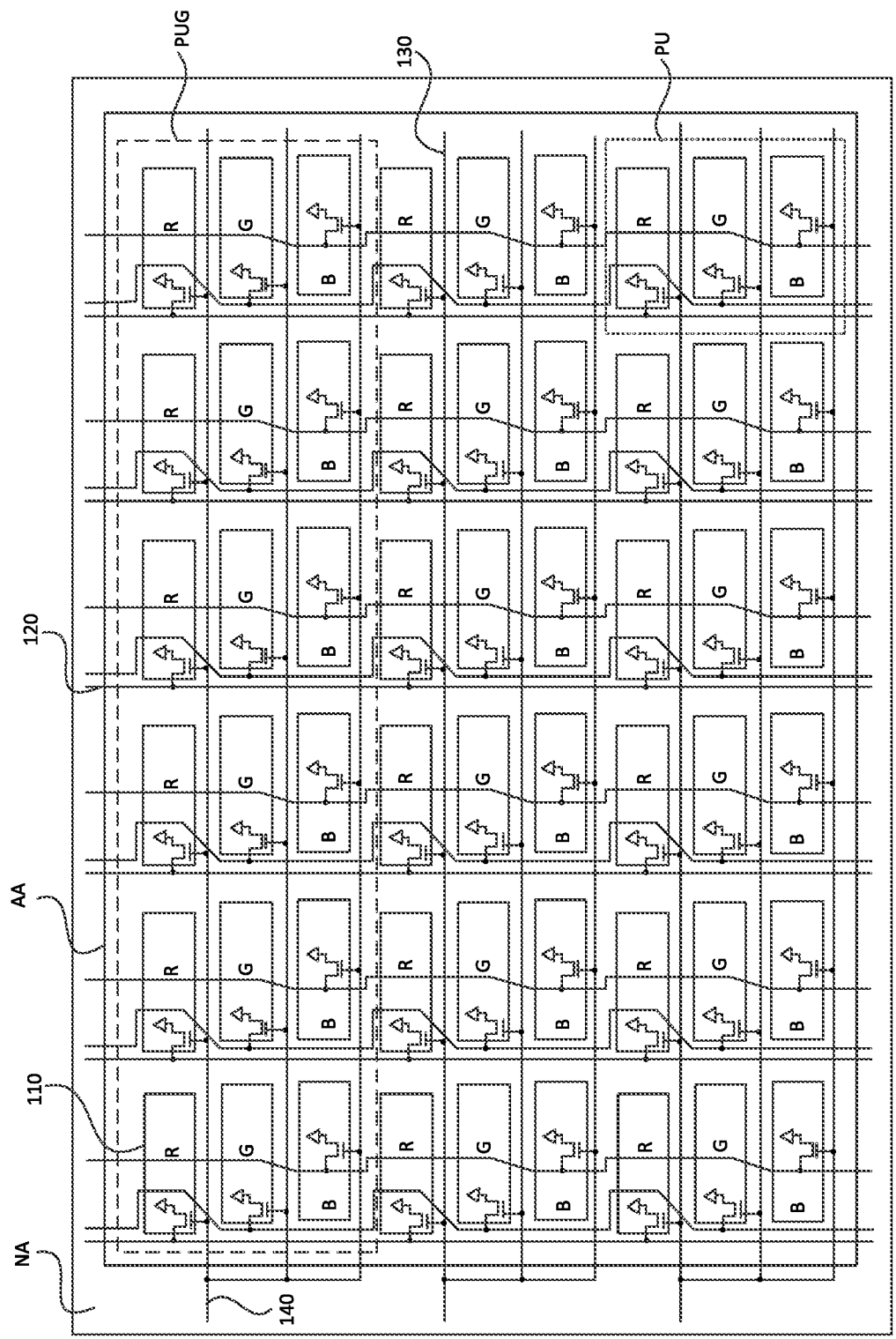
FIG. 18 is a structural diagram of yet another display panel according to an embodiment of the present disclosure.
Figure 19:
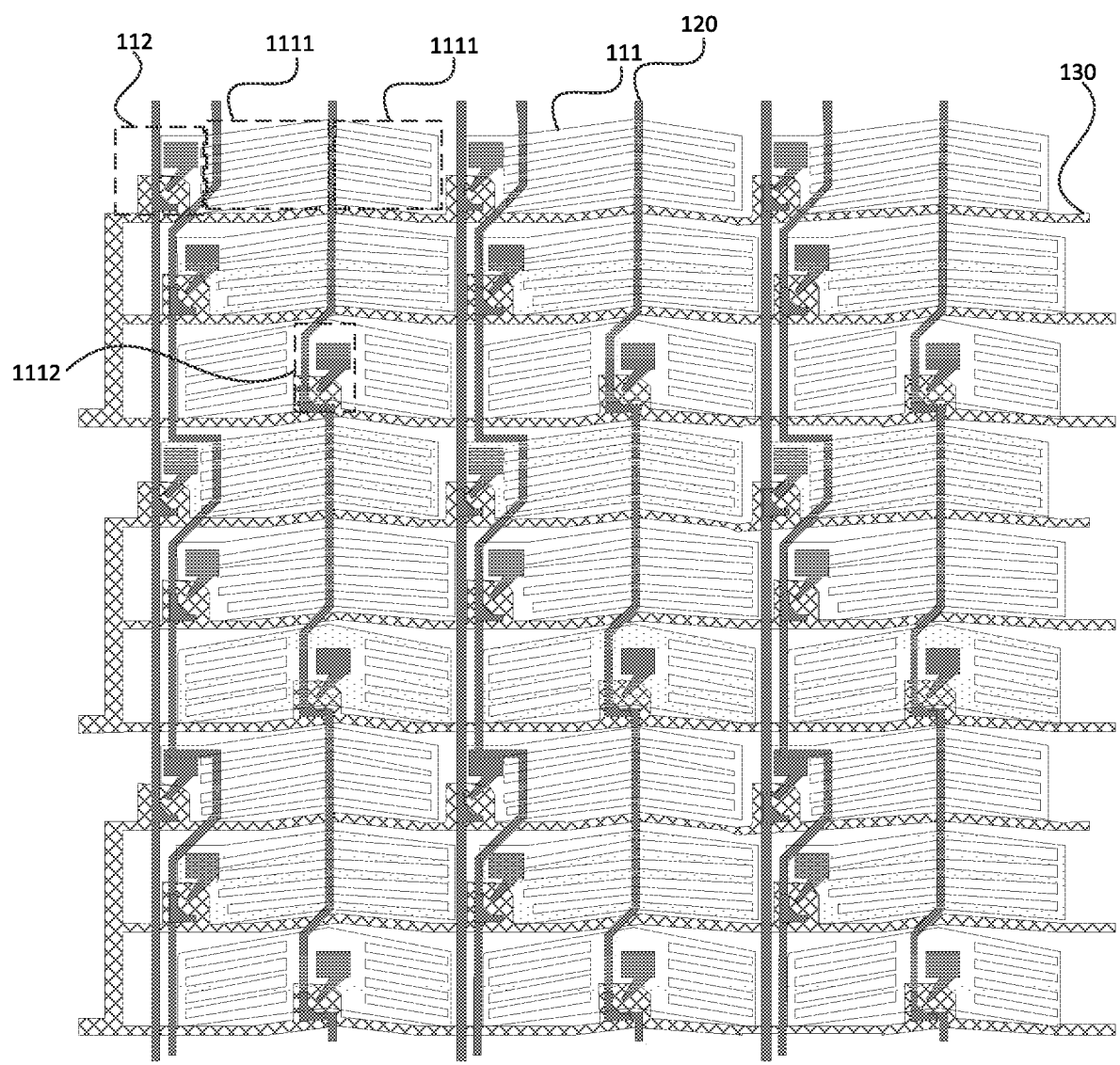
FIG. 19 is a layout of an array substrate of the display panel shown in FIG. 18.
Figure 20:
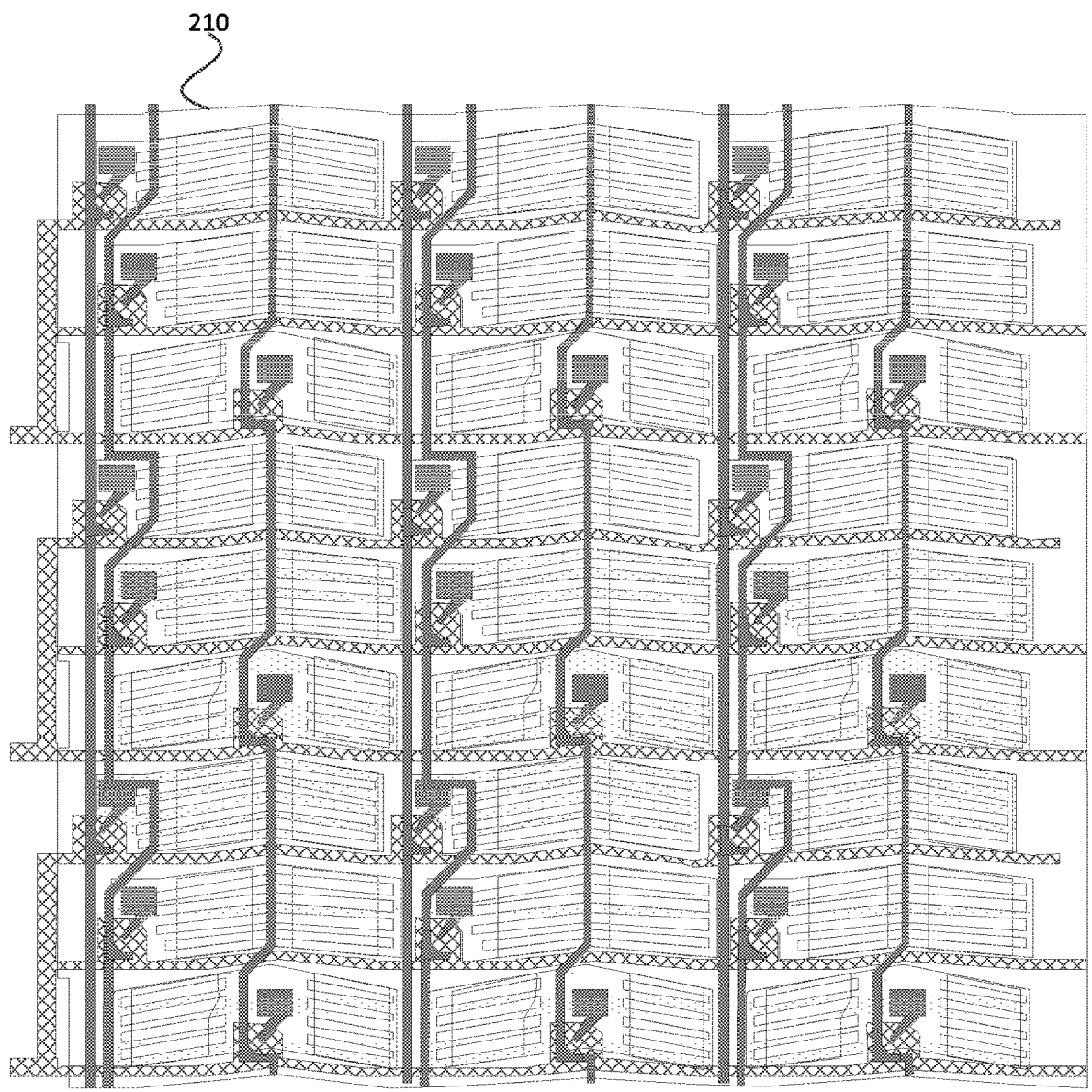
FIG. 20 is a layout of the display panel shown in FIG. 18.
Figure 21:
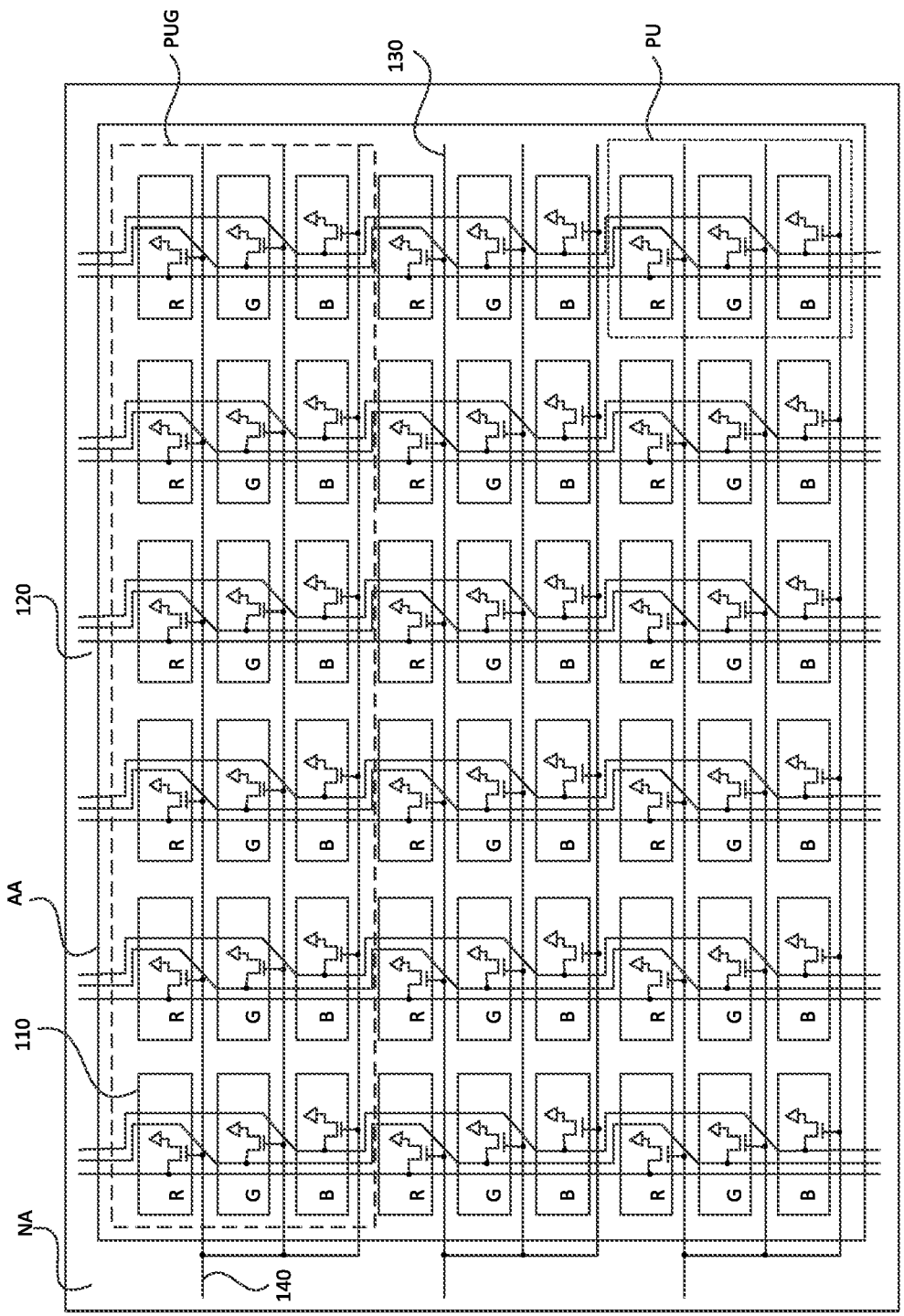
FIG. 21 is a structural diagram of yet another display panel according to an embodiment of the present disclosure.
Figure 22:
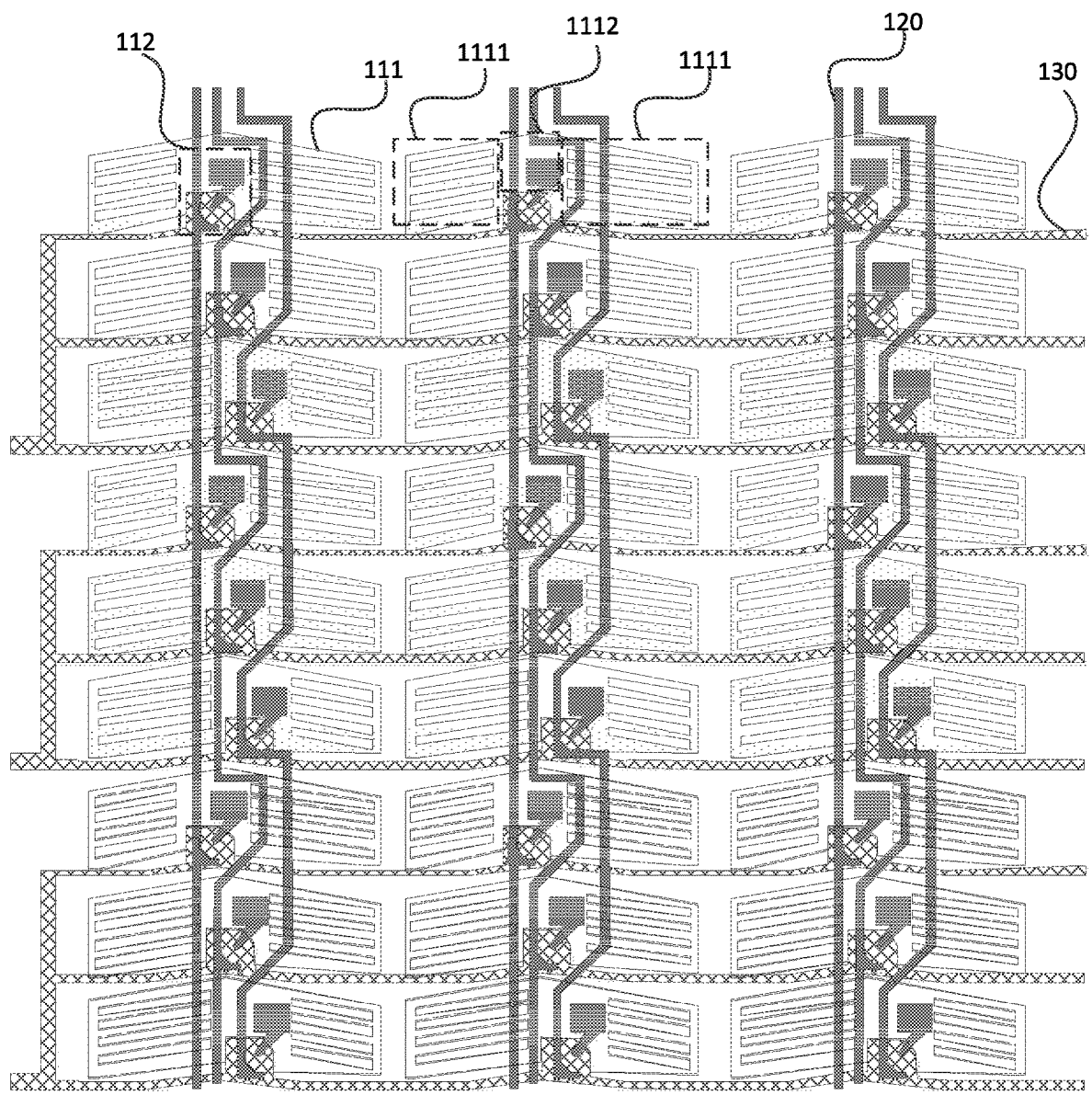
FIG. 22 is a layout of an array substrate of the display panel shown in FIG. 21.
Figure 23:
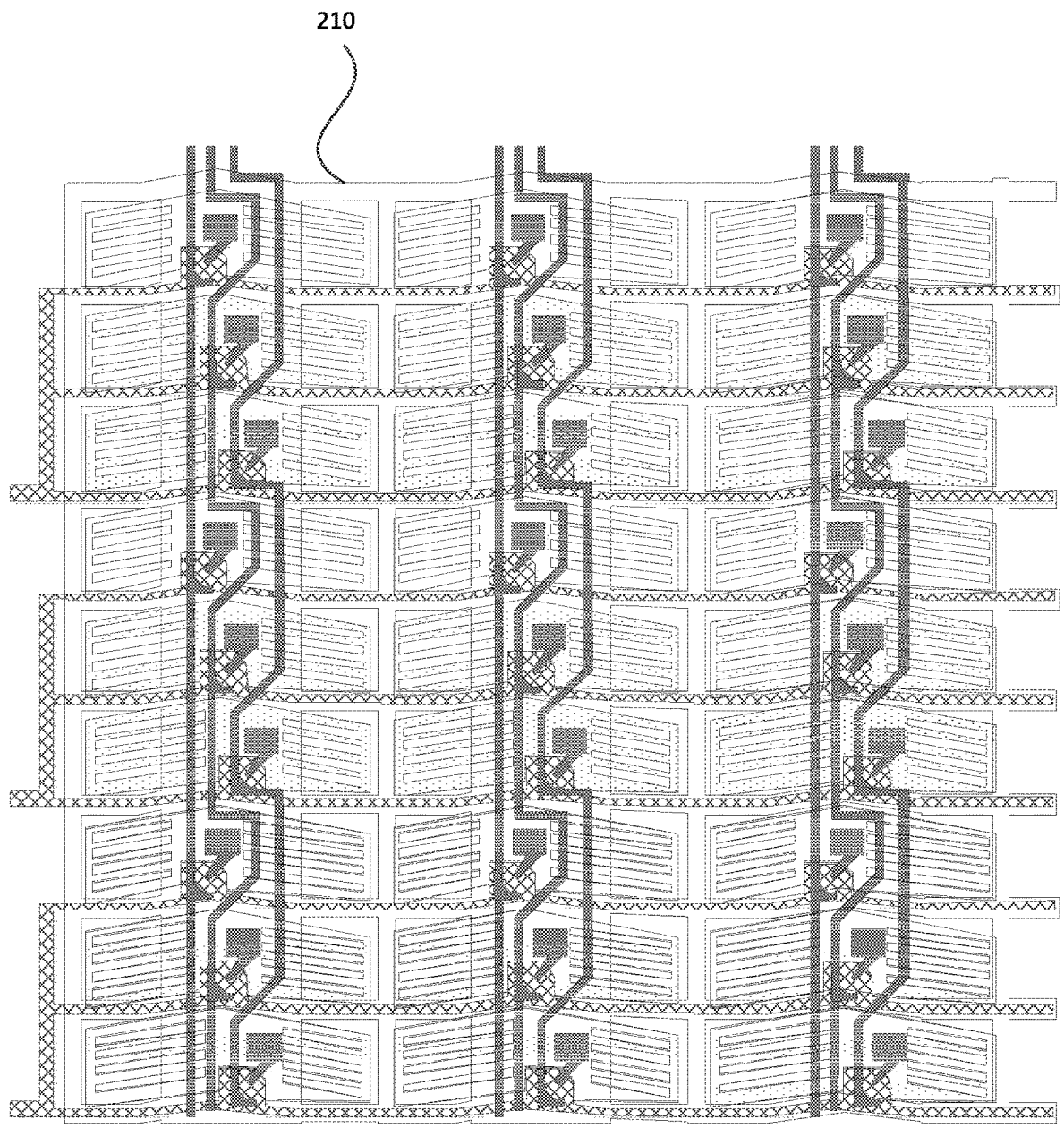
FIG. 23 is a layout of the display panel shown in FIG. 22.

FIG. 18 is a structural diagram of yet another display panel according to an embodiment of the present disclosure. FIG. 19 is a layout of an array substrate of the display panel shown in FIG. 18. FIG. 20 is a layout of the display panel shown in FIG. 18. FIG. 21 is a structural diagram of yet another display panel according to an embodiment of the present disclosure. FIG. 22 is a layout of an array substrate of the display panel shown in FIG. 21. FIG. 23 is a layout of the display panel shown in FIG. 22. The display panel shown in FIG. 18 is different from the display panel shown in FIG. 21 in that numbers of data lines 120 which have orthographic projections on a plane where the pixel electrodes 111 located between two adjacent slit groups 1111 are different. Referring to FIG. 18 to FIG. 22, in an embodiment, each pixel electrode 111 includes at least two slit groups 1111 arranged in the row direction of the matrix; each slit group 1111 includes a plurality of slits, and the extending directions of the slits in two adjacent slit groups 1111 are different; among the N data lines 120 of the same pixel unit PU, orthographic projections of M data lines 120 on the plane where the pixel electrode 111 is located are between the two adjacent columns of slit groups 1111, and orthographic projections of the N−M data lines 120 on the plane where the pixel electrode 111 is located are between the two adjacent columns of pixel electrodes 111, and among the N data lines 120 of the same pixel unit PU, a data line 120 which has an orthographic projection located between two the adjacent columns of pixel electrodes 111 is disposed on a same side of a sub-pixel 110 electrically connected to the data line, and M is an integer greater than or equal to 1 and less than or equal to N.

In one embodiment, when the pixel electrode 111 is disposed on a side of the common electrode 113 away from the substrate, a slit group 1111 is disposed on the pixel electrode 111, as shown in FIG. 19, FIG. 20, FIG. 22, and FIG. 23. When the common electrode 113 is disposed on the side of the pixel electrode 111 away from the substrate, the slit group 1111 is disposed on the common electrode 113, and the slit group 1111 is not need to be disposed on the pixel electrode 111, at this time, a position relationship between the common electrode 113 with the slit group 1111 and the data line 120 is similar to a position relationship between the pixel electrode 111 with the slit group 1111 and the data line 120. In one embodiment, each common electrode includes at least two slit groups 1111 arranged in the row direction of the matrix; each slit group 1111 includes a plurality of slits, and the extending directions of the slits in two adjacent slit groups 1111 are different; among the N data lines 120 of the same pixel unit PU, orthographic projections of M data lines 120 on the plane where the pixel electrode 111 is located are between the two adjacent columns of slit groups 1111, and orthographic projections of the N−M data lines 120 on the plane where the pixel electrode 111 is located are between the two adjacent columns of pixel electrodes 111, and among the N data lines 120 of the same pixel unit PU, a data line 120 which has an orthographic projection located between two the adjacent columns of common electrodes is disposed on a same side of a sub-pixel 110 electrically connected to the data line, and M is an integer greater than or equal to 1 and less than or equal to N. For convenience of explanation, that the slit is disposed on the pixel electrode 111 is used as an example in the following description.

In one embodiment, in general, light hardly exits at the position where two adjacent slit groups 1111 border, and the position is often defined as a domain line region. It is to be noted that, the electrode disposed between adjacent slits is called a branch electrode, which includes a first branch electrode and a second electrode connected to each other. The connection between the first and second branch electrodes has a curved shape, that is, the first and second branch electrodes extend along different directions. In this case, liquid crystal molecules at the connection of the first and second branch electrodes are turned in disorientation, and black domain lines appear and form the domain line region. Therefore, compared with a case where the data line 120 is disposed on the middle of the slit groups 1111 (that is, the data line 120 is disposed on a light emitting region), a case that the data line 120 is disposed on two adjacent columns of slit groups 1111 (that is, the data line 120 is disposed on a non-light emitting region) has a smaller influence on the aperture ratio of the sub-pixel 110, which is beneficial to improving the aperture ratio of the display panel.

In one embodiment, a number of slit groups 1111 included by each pixel electrode 111 (or the common electrode 113), a value of M, and the exact adjacent two columns of slit groups 1111 between which the M data lines 120 are disposed can be set according to a practical situation, for example, FIG. 18 to FIG. 20 exemplarily show that the pixel electrode 111 includes two slit groups 1111, and one data line 120 is disposed between the two columns of slit groups 1111; FIG. 21 to FIG. 23 exemplarily show that the pixel electrode 111 includes two slit groups 1111, and all of the three data lines 120 in the same pixel unit PU are disposed between the two slit groups 1111.

In one embodiment, each of the N−M data lines 120 may also be disposed on a first side of the sub-pixel 110 electrically connected to the each data line 120 (FIG. 18 exemplarily shows that a right side of the sub-pixel 110 is the first side of the sub-pixel 110); each of the data line 120 may also be disposed on a second side of the sub-pixel 110 electrically connected to the each data line 120 (FIG. 18 exemplarily shows that the left side of the sub-pixel 110 is the second side of the sub-pixel 110), as shown in FIG. 18, which is not limited in this application.

In one embodiment, for the third-type arrangement of data lines 120, various shapes of data lines 120 exist, and typical examples are described below.

Figure 24:
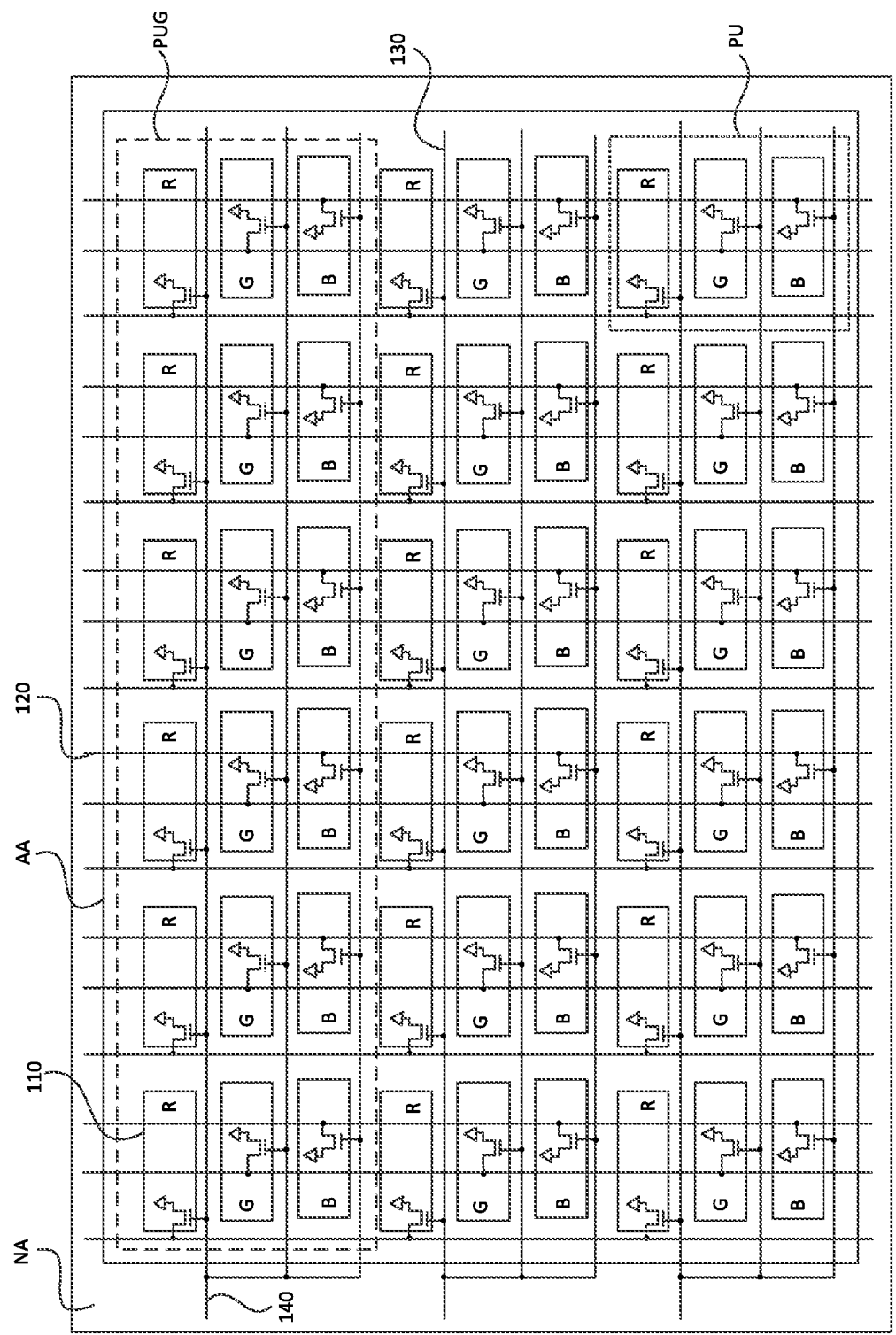
FIG. 24 is a structural diagram of a display panel according to an embodiment of the present disclosure.
Figure 25:
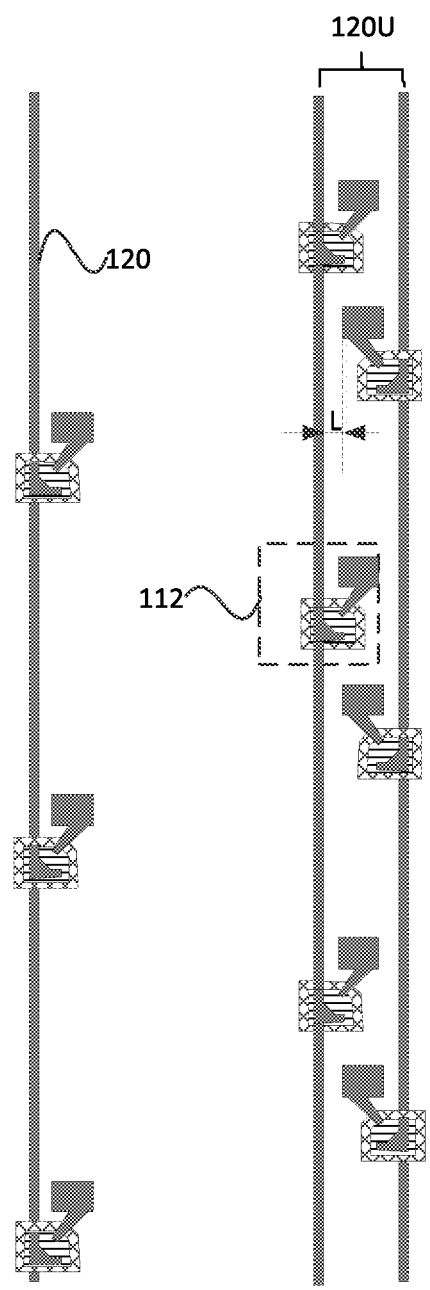
FIG. 25 is a layout of N data lines of a same pixel unit of the display panel shown in FIG. 24.

FIG. 24 is a structural diagram of a display panel according to an embodiment of the present disclosure. FIG. 25 is a layout of N data lines of a same pixel unit of the display panel shown in FIG. 24. Referring to FIG. 24 and FIG. 25, in an embodiment, in a case where M≥2, among the M data lines 120, along the column direction of the matrix, two adjacent switch transistors are disposed on different sides of a data line electrically connected to the two adjacent switch transistors as shown in FIG. 24; in a case where N−M≥2, among N−M data lines, along the column direction of the matrix, two adjacent switch transistors are disposed on different sides of a data line electrically connected to the two adjacent switch transistors; the N−M data lines 120 each are straight lines.

In one embodiment, with continued reference to FIG. 25, two adjacent data lines 120 form a data line group 120U, and when M is an odd number, the M data lines 120 include (M−1)/2 data line groups 120U and one independent data line 120; when M is an even number, M data lines 120 include N/2 data line groups 120U. Similarly, when M is an odd number, the N−M data lines 120 include (N−M−1)/2 data line groups 120U and one independent data line 120; when N−M is an even number, N−M data lines 120 include (N−m)/2 data line groups 120U. In a same data line group 120U, a distance L along the row direction of the matrix between the switch transistor 112 electrically connected to one data line 120 and another data line 120 can be set according to the practical situation.

It can be understood that, by setting each data line 120 as a straight line, the layout design of the data line 120 is simple and the manufacturing difficulty is low.

With continued reference to FIG. 18 to FIG. 23, in an embodiment, each switch transistor 112 is disposed on a first side of a data line 120 electrically connected to the each transistor 112. If N−M≥ to 2, among the N−M data lines 120, one data line 120 is a straight line, and each of the other adjacent N−M−1 data lines 120 includes a straight line segment 120Z and a bent segment 120W connected to each other, and the bent segment 120W semi-surrounds the switch transistor 112 located on the second side of the one data line 120, as shown in FIG. 18 to FIG. 20; if M is ≥2, among the M data lines 120, one data line 120 is a straight line, and each of the other adjacent M−1 data lines 120 includes a straight line segment 120Z and a bent segment 120W connected to each other, and the bent segment 120W semi-surrounds the switch transistor 112 located on the second side of the one data line 120, as shown in FIG. 21 to FIG. 23. The first side of the one data line is opposite to the one second side of the data line.

In one embodiment, the straight line segment 120Z and the bent segment 120W of the data line 120 can be understood by referring to FIG. 11 similarly, which is not described herein again. It is understood that by setting that each of the data lines 120 includes a straight line segment 120Z and a bent segment 120W connected to each other, and the bent segment 120W partially surrounds the switch transistor 112 on the second side of the data lines 120, the adjacent data lines 120 and switch transistors 112 electrically connected to the adjacent data lines 120 can be disposed together compactly, for example, shown in FIG. 18 and FIG. 20, two data lines 120 corresponding to the leftmost column of sub-pixels 110 and located between two adjacent columns of pixel electrodes 111 and switch transistors 112 electrically connected to the two data lines 120 can be disposed together compactly. For example, three data lines 120 corresponding to the sub-pixels 110 in the leftmost column shown in FIG. 21 to FIG. 23 and located between two adjacent columns of slit groups 1111 and switch transistors 112 electrically connected to the three data lines 120 are disposed together compactly. In this way, the space occupied by the data lines 120 and the switch transistors 112 can be reduced, and the width of the black matrix 210 corresponding to the position of the data lines 120 and the switch transistors 112 can be reduced, thereby improving the aperture ratio.

In one embodiment, in the same pixel unit PU, N−M data lines 120 correspond to N−M sub-pixels 110 respectively, the switch transistors 112 of the N−M sub-pixels 110 are sequentially staggered along the row direction of the matrix, and at the same time, pixel electrodes 111 of the N−M sub-pixels 110 are sequentially staggered along the row direction of the matrix, as shown in FIG. 19 and FIG. 20. In the same pixel unit PU, M data lines 120 correspond to M sub-pixels 110 respectively, the switch transistors 112 of the M sub-pixels 110 are sequentially staggered along the row direction of the matrix, and at the same time, pixel electrodes 111 of the M sub-pixels 110 are aligned along the row direction of the matrix, as shown in FIG. 22 and FIG. 23. In this way, pixel electrodes 111 of each sub-pixel 110 have a same area, and the gray scale voltages of the each sub-pixel 111 can be uniformly adjusted, thereby simplifying the driving method of the display panel. That the pixel electrodes 111 are aligned along the row direction of the matrix described herein means that a staggered distance of the pixel electrodes 111 to be aligned along the row direction of the matrix is within a preset range, and the preset range can be set according to an alignment degree that can be achieved by a practical manufacturing process, for example, the staggered distance of the pixel electrodes 111 to be aligned along the row direction of the matrix is smaller than 1 μm.

With continued reference to FIG. 19 and FIG. 22, in an embodiment, at least one pixel electrode 111 further includes an electrode block 1112, the electrode block 1112 is disposed between two adjacent slit groups 1111, and an orthographic projection of the electrode block 1112 on the substrate overlaps an orthographic projection of the switch transistor 112 on the substrate. In an embodiment, the pixel electrode 111 of the sub-pixel 110 electrically connected to the data line 120 between two adjacent columns of slit groups 1111 includes an electrode block 1112. In this way, when the switch transistor 112 and the pixel electrode 111 are electrically connected through a via hole, a contact area between the drain (or source) of the switch transistor 112 and the pixel electrode 111 can be sufficiently large, thereby ensuring reliable electrical connection between the switch transistor 112 and the pixel electrode 111.

With continued reference to FIG. 22, in an embodiment, the orthographic projection of the electrode block 1112 on the substrate at least partially does not overlap an orthographic projection of a gate of the switch transistor 112 on the substrate. In one embodiment, when the pixel electrode 111 is electrically connected to the drain of the switch transistor 112, the orthogonal projection of the electrode block 1112 on the substrate may be configured to at least partially overlap the orthogonal projection of the drain of the switch transistor 112 on the substrate, and at the same time, the orthogonal projection of the electrode block 1112 on the substrate does not overlap the orthogonal projections of the source and gate of the switch transistor 112 on the substrate; when the pixel electrode 111 is electrically connected to the source of the switch transistor 112, the orthographic projection of the electrode block 1112 on the substrate may be configured to at least partially overlap the orthographic projection of the source of the switch transistor 112 on the substrate, at the same time, the orthographic projection of the electrode block 1112 on the substrate does not overlap the orthographic projections of the drain and gate of the switch transistor 112 on the substrate. In this way, while the switch transistor 112 and the pixel electrode 111 are reliably electrically connected, parasitic capacitance between the pixel electrode 111 and the switch transistor 112 can be reduced, thereby reducing the influence of the parasitic capacitance on the display, and improving the display effect.

With continued reference to FIG. 18 to FIG. 20, if M=1, the data line 120 which has a orthographic projection located between two adjacent columns of slit groups 1111 on the plane where the pixel electrode 111 is located includes a straight line segment 120Z and a bent segment 120W, and the bent segment 120W semi-surrounds the switch transistor 112 electrically connected to the data line 120. In this way, the switch transistor 112 and the straight line segments 120Z of the data line 120 are disposed on a same straight line, that is, areas of the pixel electrodes 111 corresponding to the two sides of the switch transistor 112 are close, thereby avoiding color cast at a large viewing angle.

Exemplarily, in the layout of the display panel shown in FIG. 19, the same pixel unit PU includes three sub-pixels 110 which are electrically connected to three data lines 120. The switch transistors 112 of two sub-pixels 110 are sequentially staggered along the row direction of the matrix, at the same time, the pixel electrodes 111 of the two sub-pixels 110 are sequentially staggered along the row direction of the matrix, and each sub-pixel 110 includes two slit groups 1111; orthographic projections of the two data lines 120 electrically connected to the two sub-pixels 110 on the plane where the pixel electrodes 111 are located are between two adjacent columns of pixel electrodes 111 and disposed on the second side of the sub-pixels 110 electrically connected to the data lines; among the two data lines 120, one data line 120 is a straight line, another data line 120 include a straight line segment 120Z and a bent segment 120W, and the bent segment 120W semi-surrounds the switch transistor 112 disposed on the second side of the data line 120. The another one sub-pixel 110 is aligned with an adjacent sub-pixel 110 in the pixel unit PU to which the another one sub-pixel 110 belongs, the pixel electrode 111 of the sub-pixel 110 includes two slit groups 1111 and an electrode block 1112, a difference of areas of pixel electrode 111 portions at two sides of the electrode block 1112 is within a preset range, a vertical projection of the electrode block 1112 on the substrate overlaps a vertical projection of the switch transistor 112 electrically connected to the electrode block 1112 on the substrate; an orthogonal projections of the data line 120 electrically connected to the sub-pixel 110 on the plane where the pixel electrode 111 is located is between the two adjacent columns of slit groups 1111, and the data line 120 includes a straight line segment 120Z and a bent segment 120W, and the bent segment 120W semi-surrounds the switch transistor 112 electrically connected to the data line 120.

With continued reference to FIG. 22, in the same pixel unit PU, the pixel electrodes 111 of the each sub-pixel 110 have a same area, and the each sub-pixel 110 is flush along the row direction of the matrix; the pixel electrode 111 further includes at least two slit groups 1111 and at least one electrode block 1112, the electrode block 1112 is disposed between two adjacent slit groups 1111, and an orthogonal projection of the electrode block 1112 on the substrate overlaps an orthogonal projection of the switch transistor 112 on the substrate. Exemplarily, in the layout of the display panel shown in FIG. 22, the same pixel unit PU includes three sub-pixels 110 which are electrically connected to three data lines 120. The switch transistors 112 of the three sub-pixels 110 are sequentially staggered along the row direction of the matrix, at the same time, the pixel electrodes 111 of the three sub-pixels 110 are aligned along the row direction of the matrix, each sub-pixel 110 includes two slit groups 1111 and an electrode block 1112, a difference of areas of the pixel electrodes 111 at two sides of the electrode block 1112 is within a preset range, and a vertical projection of the electrode block 1112 on the substrate overlaps a vertical projection of the switch transistors 112 electrically connected to the electrode block 1112 on the substrate; orthographic projections of the three data lines 120 on the plane where the pixel electrode 111 is located are between the two adjacent columns of slit groups 1111; among the 3 data lines 120, one data line 120 is a straight line, each of the other two data lines 120 includes a straight line segment 120Z and a bent segment 120W, and the bent segment 120W semi-surrounds the switch transistor 112 located on the second side of the one data line 120.

In an embodiment, the display panel further includes a support post; in a case where M>N−M, an orthographic projection of the support post on the plane where the pixel electrode 111 is located is between two adjacent columns of slit groups 1111; and in a case where M≤N−M, an orthographic projection of the support post on the plane where the pixel electrode 111 is located is between two adjacent columns of pixel electrodes 111.

In one embodiment, the support post is used for supporting the color film substrate 20, to prevent the color film substrate 20 from collapsing and further affecting a thickness of a liquid crystal cell. In order to avoid the influence of the supporting post on the display, a vertical projection of the supporting post on the substrate should be covered by a vertical projection of the black matrix 210 on the substrate, and in general, a vertical projection area of the supporting post on the substrate is relatively large, so a width of a corresponding black matrix 210 above the supporting post along the row direction of the matrix is also wider, and a width of the black matrix 210 corresponding to a position where a number of the data lines 120 is large along the row direction of the matrix is also wider, so that the black matrix 210 can be fully and effectively utilized when the supporting post is disposed on a position where the number of the data lines 120 is larger, compared with when the supporting post is disposed on a position where the number of the data lines 120 is smaller, which is conductive to improving the aperture ratio. Exemplarily, for the display panel shown in FIG. 20, the number of the data lines 120 disposed between two adjacent columns of the pixel electrodes 111 is larger, and therefore, the supporting post may be disposed between two adjacent columns of the pixel electrodes 111; for the display panel shown in FIG. 24, the number of the data lines 120 disposed between two adjacent columns of slit groups 1111 is larger, and therefore, the supporting post may also be disposed between two adjacent columns of slit groups 1111.

It should be noted that, two columns of sub-pixels 110 located at an edge of the display panel each have only one column of sub-pixels 110 adjacent to each of the two columns of sub-pixels 110, for example, a left column of sub-pixels 110 located at the leftmost side of the display panel has one column of sub-pixels 110 adjacent to left column of sub-pixels 110, for the leftmost column of sub-pixels 110, "the data line 120 is located on the first side of the sub-pixel 110 electrically connected to the data line 120" means that the orthographic projection of the data line 120 on the plane where the pixel electrode 111 is located is on the first side of the pixel electrode 111 corresponding to the sub-pixel 110 electrically connected to the data line 120, and "the data line 120 is located on the second side of the sub-pixel 110 electrically connected to the data line 120" means that the orthographic projection of the data line 120 on the plane where the pixel electrode 111 is located is on the second side of the pixel electrode 111 corresponding to the sub-pixel 110 electrically connected to the data line 120. The rightmost column of sub-pixels 110 is similar, which is not repeated herein.

It should be further noted that FIG. 1, FIG. 2, FIG. 3, FIG. 10, FIG. 12, FIG. 18, FIG. 21, and FIG. 24 only exemplarily show that the sub-pixels include a red sub-pixel R, a green sub-pixel G, and a blue sub-pixel B, and exemplarily show that the sub-pixels located in a same row emit light of a same color, but is not limited to this application, and set emitting colors of the sub-pixels and an arrangement manner of sub-pixels of each emitting color in the display panel according to the practical situation, for example, in other implementation, the sub-pixels may include a red sub-pixel R, a green sub-pixel G, a blue sub-pixel B, and a white sub-pixel; the sub-pixels in a same row may include at least sub-pixels of two emitting colors.

It should be further noted that, for convenience of drawing, FIG. 14, FIG. 15, FIG. 17, FIG. 19, FIG. 20, FIG. 22, and FIG. 23 only exemplarily show the film layers related to the data line 120, the scanning line 130, the pixel electrode 111, and the switch transistor 112 (the active layer of the switch transistor 112 is not shown) in the array substrate 10, FIG. 22 only exemplarily show the film layers related to the data line 120, the scanning line 130, the common electrode 113, and the switch transistor 112 (the active layer of the switch transistor 112 is not shown) in the array substrate 10, but the array substrate 10 includes not only the above film layers but also other film layers, which is not described again in this application. In addition, FIG. 15, FIG. 20, and FIG. 23 only exemplarily show the black matrix 210 in the color film substrate 20, but the color film substrate 20 does not only include the above film layers, and also includes other film layer structures, which is not described again in this application.

On the basis of the above, in an embodiment, each switch transistor 112 is disposed on a same side of the scanning line 130 electrically connected to the each switch transistor. In this way, in the practical manufacturing process of the display panel, the influence of the process fluctuation on each switch transistor 112 is consistent, which is beneficial to improving the uniformity of each sub-pixel 110, and further improving the display effect.

On the basis of the above, in an embodiment, a source and a drain of each switch transistor 112 are disposed in a same layer as the data line 120. In this way, the source and drain of each switch transistor 112 and the data line 120 can be formed through the same process, so that the manufacturing process of the display panel is simple, which is beneficial to reducing the cost and implementing the thinning of the display panel.

On the basis of the above, with continued reference to FIG. 5, in an embodiment, the display panel includes a first region, a second region, a third region, a fourth region, and a fifth region arranged along the row direction of the matrix; along the row direction of the matrix, a width of the black matrix in the first region, the third region and the fifth region is smaller than a width of the black matrix in the second region and the fourth region.

It can be understood that, when the display panel is attached to a curved cover plate, due to an adhesive fixing function of an adhesive frame 40, offsets of the color film substrate 20 and the array substrate 10 in the first region and the fifth region are smaller, and at the same time, due to small bending degrees of the color film substrate 20 and the array substrate 10 corresponding to the third region, the offsets of the color film substrate 20 and the array substrate 10 in the first region and the fifth region are also smaller. When widening the width of the portion of the black matrices 210 extending along the column direction of the matrix in the row direction of the matrix, an amount of widening of each black matrix 210 located in the first region, the third region, and the fifth region can be set to be smaller than an amount of widening of each black matrix 210 located in the second region and the fourth region, that is, a width of each black matrix 210 in the first region, the third region and the fifth region is smaller than a width of each black matrix 210 in the second region and the fourth region. Therefore, the color mixing and light leakage can be avoided, and the aperture ratio can be further improved. It should be noted that, a width of the black matrix 210 corresponding to each region can be set according to practical situation.

On the basis of the above, with continued reference to FIG. 1 to FIG. 3, in an embodiment, the display panel includes a display region AA and a non-display region NA surrounding the display region AA; a plurality of scanning connecting leads 140 is disposed on the non-display region NA; and N scanning lines 130 of the same pixel unit group PUG extend to the non-display region NA and are electrically connected to a same scanning connecting lead 140. In this way, a number of the scanning connecting leads 140 can be reduced, and a area of the non-display region NA occupied by the scanning connecting leads 140 can be reduced, thereby reducing the area of the non-display region NA and implementing a narrow frame.

In one embodiment, the scanning connecting lead 140 may be directly connected to a gate driving circuit of the non-display region NA, and the gate driving circuit provides a scanning signal to the scanning line 130; the scanning connecting lead 140 may also be directly connected to a driving chip of the non-display region NA, and the driving chip directly provides the scanning signal to the scanning line 130, which is not limited in this application.

Based on a same inventive conception described above, the present disclosure further provides a display device including the display panel described in any one of embodiments. Therefore, the display device also has the beneficial effects of the display panel provided by the embodiments of the disclosure, and the same parts can be understood by referring to the above description, which is not repeated in the following description.

Figure 26:
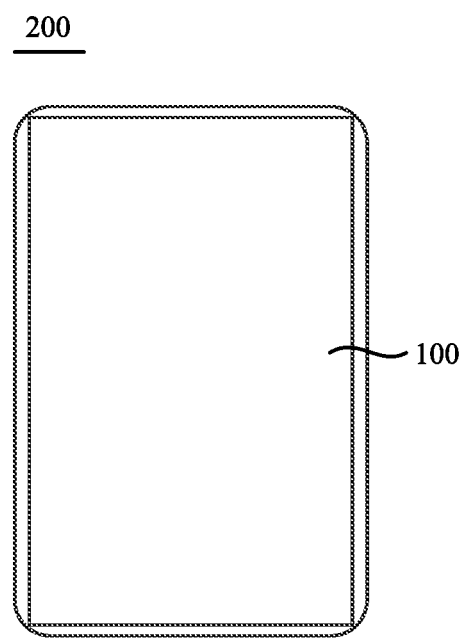
FIG. 26 is a structural diagram of a display device according to an embodiment of the present disclosure.

Exemplarily, FIG. 26 is a schematic diagram of a display device according to an embodiment of the present disclosure. As shown in FIG. 26, a display device 200 according to an embodiment of the present disclosure includes the display panel 100 according to any embodiment of the present disclosure. The display device 200 may be any electronic device with a display function, such as a touch display screen, a mobile phone, a tablet computer, a notebook computer, a television, or the like.

What is claimed is:

1. A display panel, comprising a substrate and a plurality of sub-pixels disposed on the substrate, wherein the plurality of sub-pixels is arranged in a matrix; the display panel further comprises on the substrate a plurality of scanning lines extending along a row direction of the matrix and a plurality of data lines extending along a column direction of the matrix;

wherein each row of sub-pixels among the plurality of sub-pixels is electrically connected to a corresponding scanning line among the plurality of scanning lines; along the column direction of the matrix, adjacent N rows of sub-pixels form a pixel unit group, N scanning lines of a same pixel unit group are electrically connected, and sub-pixels of the same pixel unit group are electrically connected to different data lines;

each sub-pixel among the plurality of sub-pixels comprises a first edge, a second edge, a third edge, and a fourth edge, the first edge and the third edge extend along the column direction of the matrix, and the second edge and the fourth edge extend along the row direction of the matrix; a length of the first edge along the column direction of the matrix is smaller than a length of the second edge along the row direction of the matrix;

each sub-pixel comprises a switch transistor; along the column direction of the matrix, adjacent N sub-pixels form a pixel unit; among N switch transistors of a same pixel unit, orthographic projections of at least two switch transistors on a preset plane at least partially overlap, wherein N is an integer greater than or equal to 2 and the preset plane is perpendicular to the substrate and parallel to the plurality of scanning lines; and each sub-pixel comprises a pixel electrode; among N data lines of the same pixel unit, an orthographic projection of at least one data line on the substrate overlaps an orthographic projection of at least one pixel electrode on the substrate.

2. The display panel of claim 1, wherein orthographic projections of the N data lines of the same pixel unit on a plane where the pixel electrode is located are between two adjacent columns of pixel electrodes, and the N data lines of the same pixel unit are disposed on a same side of respective sub-pixels electrically connected to the N data lines.

3. The display panel of claim 1, wherein orthographic projections of the N data lines of the same pixel unit on a plane where the pixel electrode is located are between two adjacent columns of pixel electrodes, and among the N data lines of the same pixel unit, at least one data line is disposed on a first side of a sub-pixel electrically connected to the at least one data line, and at least one data line is disposed on a second side of a sub-pixel electrically connected to the at least one data line, wherein the first side of the sub-pixel is opposite to the second side of the sub-pixel.

4. The display panel of claim 2, wherein each switch transistor is disposed on a first side of a data line electrically connected to each switch transistor among the plurality of data lines; and among the N data lines of the same pixel unit, one data line is a straight line, and each of other N−1 data lines adjacent to the one data line comprises a straight line segment and a bent segment which are mutually connected, wherein the bent segment partially surrounds a switch transistor located on a second side of the data line, and the first side is opposite to the second side.

5. The display panel of claim 2, wherein among N switch transistors of the same pixel unit, along the column direction of the matrix, two adjacent switch transistors are disposed on different sides of a data line electrically connected to the two adjacent switch transistors among the plurality of data lines, and the data line each is a straight line.

6. The display panel of claim 1, wherein each pixel electrode comprises at least two slit groups arranged along the row direction of the matrix; each slit group of the at least two slit groups comprises a plurality of slits, and slits in two adjacent slit groups have different extending directions; and among the N data lines of the same pixel unit, orthographic projections of M data lines on a plane where the pixel electrode is located are between two adjacent columns of slit groups of the at least two slit groups, orthographic projections of N−M data lines on the plane where the pixel electrode is located are between two adjacent columns of pixel electrodes, and among the N data lines of the same pixel unit, a data line among the plurality of data lines which has an orthographic projection located between two the adjacent columns of pixel electrodes is disposed on a same side of a sub-pixel electrically connected to the data line, and M is an integer greater than or equal to 1 and less than or equal to N.

7. The display panel of claim 6, wherein each switch transistor is disposed on a first side of a data line electrically connected to each switch transistor among the plurality of data lines;

in a case where M≥2, among the M data lines, one data line is a straight line, each of other adjacent M−1 data lines comprises a straight line segment and a bent segment which are mutually connected, and a bent segment semi-surrounds a switch transistor located on a second side of the one data line; and in a case where N−M≥2, among the N−M data lines, one data line is a straight line, each of other adjacent N−M−1 data lines comprises a straight line segment and a bent segment which are mutually connected, and the bent segment semi-surrounds a switch transistor located on a second side of the one data line, wherein the first side of the one data line is opposite to the second side of the one data line.

8. The display panel of claim 6, wherein in a case where M=1, a data line, which has an orthographic projection on the plane where the pixel electrode is located is between two adjacent columns of slit groups, comprises a straight line segment and a bent segment, and a bent segment semi-surrounds a switch transistor electrically connected to the data line.

9. The display panel of claim 6, wherein
in a case where M≥2, among the M data lines, along the column direction of the matrix, two adjacent switch transistors are disposed on different sides of a data line electrically connected to the two adjacent switch transistors among the plurality of data lines; and
in a case where N−M≥2, among N−M data lines, along the column direction of the matrix, two adjacent switch transistors are disposed on different sides of a data line electrically connected to the two adjacent switch transistors among the plurality of data lines; and
the data line each is a straight line.

10. The display panel of claim 6, wherein
at least one pixel electrode further comprises an electrode block, the electrode block is disposed between two adjacent slit groups, and an orthographic projection of the electrode block on the substrate overlaps an orthographic projection of the switch transistor on the substrate.

11. The display panel of claim 10, wherein the orthographic projection of the electrode block on a substrate at least partially does not overlap an orthographic projection of a gate of the switch transistor on the substrate.

12. The display panel of claim 6, further comprising a support post, wherein
in a case where M>N−M, an orthographic projection of the support post on the plane where the pixel electrode is located is between two adjacent columns of slit groups; and
in a case where M≤N−M, an orthographic projection of the support post on the plane where the pixel electrode is located is between two adjacent columns of slit groups.

13. The display panel of claim 1, wherein pixel electrodes of each sub-pixel have a same area, at least two adjacent sub-pixels in the same pixel unit are staggered or flush in the row direction of the matrix.

14. The display panel of claim 1, wherein pixel electrodes of each sub-pixel have a same area, at least two adjacent sub-pixels in the same pixel unit are flush in the row direction of the matrix.

15. The display panel of claim 4, wherein in the same pixel unit, pixel electrodes of each sub-pixel have a same area, and two adjacent sub-pixels are staggered in the row direction of the matrix.

16. The display panel of claim 7, wherein, in a case where M=0, in the same pixel unit, pixel electrodes of all sub-pixels have a same area, and all sub-pixel are flushed in the row direction of the matrix; and
each pixel electrode of the pixel electrodes further comprises at least two slit groups and at least one electrode block, the at least one electrode block is disposed between two adjacent slit groups, and an orthographic projection of the at least one electrode block on the substrate overlaps an orthographic projection of the switch transistor on the substrate.

17. The display panel of claim 1, wherein each switch transistor is disposed on a same side of a scanning line electrically connected to each switch transistor of the plurality of scanning lines.

18. The display panel of claim 1, comprising a first region, a second region, a third region, a fourth region, and a fifth region arranged along the row direction of the matrix; wherein
along the row direction of the matrix, a width of each black matrix in the first region, the third region and the fifth region is smaller than a width of each black matrix in the second region and the fourth region.

19. The display panel of claim 1, comprising a display region and a non-display region surrounding the display region; wherein
a plurality of scanning connecting leads is disposed on the non-display region; and
the N scanning lines of the same pixel unit group extend to the non-display region and are electrically connected to a same scanning connecting lead among the plurality of scanning connecting leads.

20. A display device, comprising a display panel,
wherein the display panel comprises a substrate and a plurality of sub-pixels disposed on the substrate, wherein the plurality of sub-pixels is arranged in a matrix; the display panel further comprises on the substrate a plurality of scanning lines extending along a row direction of the matrix and a plurality of data lines extending along a column direction of the matrix;
wherein each row of sub-pixels among the plurality of sub-pixels is electrically connected to a corresponding scanning line among the plurality of scanning lines; along the column direction of the matrix, adjacent N rows of sub-pixels form a pixel unit group, N scanning lines of a same pixel unit group are electrically connected, and sub-pixels of the same pixel unit group are electrically connected to different data lines;
each sub-pixel among the plurality of sub-pixels comprises a first edge, a second edge, a third edge, and a fourth edge, the first edge and the third edge extend along the column direction of the matrix, and the second edge and the fourth edge extend along the row direction of the matrix; a length of the first edge along the column direction of the matrix is smaller than a length of the second edge along the row direction of the matrix;
each sub-pixel comprises a switch transistor; along the column direction of the matrix, adjacent N sub-pixels form a pixel unit; among N switch transistors of a same pixel unit, orthographic projections of at least two switch transistors on a preset plane at least partially overlap, wherein N is an integer greater than or equal to 2 and the preset plane is perpendicular to the substrate and parallel to the plurality of scanning lines; and
each sub-pixel comprises a pixel electrode; among N data lines of the same pixel unit, an orthographic projection of at least one data line on the substrate overlaps an orthographic projection of at least one pixel electrode on the substrate.

* * * * *